United States Patent
Ko et al.

(10) Patent No.: US 10,410,993 B2
(45) Date of Patent: *Sep. 10, 2019

(54) MANUFACTURING METHOD OF SEMICONDUCTOR DEVICE AND SEMICONDUCTOR DEVICE THEREOF

(71) Applicant: Amkor Technology, Inc., Tempe, AZ (US)

(72) Inventors: Yeong Beom Ko, Gwangju (KR); Jin Han Kim, Namyangju-si (KR); Dong Jin Kim, Gwangju (KR); Do Hyung Kim, Seongnam-si (KR); Glenn Rinne, Apex, NC (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/107,677

(22) Filed: Aug. 21, 2018

(65) Prior Publication Data

US 2018/0374820 A1    Dec. 27, 2018

Related U.S. Application Data

(63) Continuation of application No. 15/831,771, filed on Dec. 5, 2017, now Pat. No. 10,056,349, which is a
(Continued)

(30) Foreign Application Priority Data

Aug. 20, 2014    (KR) .......................... 10-2014-0108365

(51) Int. Cl.
*H01L 21/00* (2006.01)
*H01L 23/00* (2006.01)
(Continued)

(52) U.S. Cl.
CPC ............ *H01L 24/96* (2013.01); *H01L 21/311* (2013.01); *H01L 21/486* (2013.01); *H01L 21/4853* (2013.01); *H01L 21/4857* (2013.01); *H01L 21/563* (2013.01); *H01L 21/565* (2013.01); *H01L 21/6835* (2013.01); *H01L 21/78* (2013.01); *H01L 23/3114* (2013.01); *H01L 23/3185* (2013.01); *H01L 23/49811* (2013.01);
(Continued)

(58) Field of Classification Search
CPC ............... H01L 23/3135; H01L 21/563; H01L 2924/3511; H01L 2924/181; H01L 2224/26175; H01L 2224/32145
USPC ....... 438/106, 107, 108, 109, 110, 125, 126, 438/127
See application file for complete search history.

(56) References Cited

U.S. PATENT DOCUMENTS 10,056,349 B2 *  8/2018  Ko et al. ................. H01L 25/50
2010/0109169 A1 * 5/2010  Kolan ................... H01L 21/486
                                                                  257/787
(Continued)

*Primary Examiner* — S. V. Clark
(74) *Attorney, Agent, or Firm* — McAndrews, Held & Malloy, Ltd.

(57) ABSTRACT

A semiconductor device structure and a method for manufacturing a semiconductor device. As a non-limiting example, various aspects of this disclosure provide a method for manufacturing a semiconductor device that comprises ordering and performing processing steps in a manner that prevents warpage deformation from occurring to a wafer and/or die due to mismatching thermal coefficients.

20 Claims, 35 Drawing Sheets

Related U.S. Application Data continuation of application No. 15/346,507, filed on Nov. 8, 2016, now Pat. No. 9,837,376, which is a continuation of application No. 14/692,152, filed on Apr. 21, 2015, now Pat. No. 9,490,231.

(51) Int. Cl.
    *H01L 25/00*     (2006.01)
    *H01L 21/683*     (2006.01)
    *H01L 21/311*     (2006.01)
    *H01L 25/065*     (2006.01)
    *H01L 23/498*     (2006.01)
    *H01L 21/48*     (2006.01)
    *H01L 23/538*     (2006.01)
    *H01L 21/56*     (2006.01)
    *H01L 21/78*     (2006.01)
    *H01L 23/31*     (2006.01)

(52) U.S. Cl.
    CPC .. *H01L 23/49816* (2013.01); *H01L 23/49822* (2013.01); *H01L 23/49838* (2013.01); *H01L 23/49894* (2013.01); *H01L 23/5384* (2013.01); *H01L 23/562* (2013.01); *H01L 24/16* (2013.01); *H01L 24/81* (2013.01); *H01L 25/0655* (2013.01); *H01L 25/50* (2013.01); *H01L 21/561* (2013.01); *H01L 21/568* (2013.01); *H01L 23/3128* (2013.01); *H01L 23/49827* (2013.01); *H01L 23/5389* (2013.01); *H01L 24/97* (2013.01); *H01L 2221/6834* (2013.01); *H01L 2221/68327* (2013.01); *H01L 2221/68345* (2013.01); *H01L 2221/68363* (2013.01); *H01L 2221/68381* (2013.01); *H01L 2224/131* (2013.01); *H01L 2224/16227* (2013.01); *H01L 2224/16237* (2013.01); *H01L 2224/32225* (2013.01); *H01L 2224/32245* (2013.01); *H01L 2224/73204* (2013.01); *H01L 2224/73253* (2013.01); *H01L 2224/81005* (2013.01); *H01L 2224/83005* (2013.01); *H01L 2224/92125* (2013.01); *H01L 2224/97* (2013.01); *H01L 2924/01014* (2013.01); *H01L 2924/157* (2013.01); *H01L 2924/15311* (2013.01); *H01L 2924/15321* (2013.01); *H01L 2924/15788* (2013.01); *H01L 2924/1811* (2013.01); *H01L 2924/18161* (2013.01); *H01L 2924/3025* (2013.01); *H01L 2924/351* (2013.01)

(56) References Cited

U.S. PATENT DOCUMENTS

| | | | |
|---|---|---|---|
| 2014/0091461 A1* | 4/2014 | Shen | H01L 23/24 257/738 |
| 2015/0333049 A1* | 11/2015 | Woychik | H01L 25/00 438/107 |
| 2016/0104656 A1* | 4/2016 | Luan | H01L 21/561 257/738 |

\* cited by examiner

MANUFACTURING METHOD OF SEMICONDUCTOR DEVICE AND SEMICONDUCTOR DEVICE THEREOF

CROSS-REFERENCE TO RELATED APPLICATIONS/INCORPORATION BY REFERENCE

The present application is a continuation of U.S. patent application Ser. No. 15/831,771, filed Dec. 5, 2017, titled "MANUFACTURING METHOD OF SEMICONDUCTOR DEVICE AND SEMICONDUCTOR DEVICE THEREOF," expected to issue as U.S. Pat. No. 10,056,349; which is a continuation of U.S. patent application Ser. No. 15/346,507, filed Nov. 8, 2016, titled "MANUFACTURING METHOD OF SEMICONDUCTOR DEVICE AND SEMICONDUCTOR DEVICE THEREOF," now U.S. Pat. No. 9,837,376; which is a continuation of U.S. patent application Ser. No. 14/692,152, filed Apr. 21, 2015, titled "MANUFACTURING METHOD OF SEMICONDUCTOR DEVICE AND SEMICONDUCTOR DEVICE THEREOF," now U.S. Pat. No. 9,490,231; which makes reference to, claims priority to, and claims the benefit of Korean Patent Application No. 10-2014-0108365, filed on Aug. 20, 2014 in the Korean Intellectual Property Office and titled "MANUFACTURING METHOD OF SEMICONDUCTOR DEVICE AND SEMICONDUCTOR DEVICE THEREOF," the contents of each of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present systems, methods and/or architectures for forming electronic packages with stacked components, for example utilizing a combination of organic and inorganic materials with different respective thermal expansion coefficients, are inadequate. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

The accompanying drawings are included to provide a further understanding of the present disclosure, and are incorporated in and constitute a part of this specification. The drawings illustrate examples of the present disclosure and, together with the description, serve to explain various principles of the present disclosure. In the drawings.

SUMMARY

Figure 1:
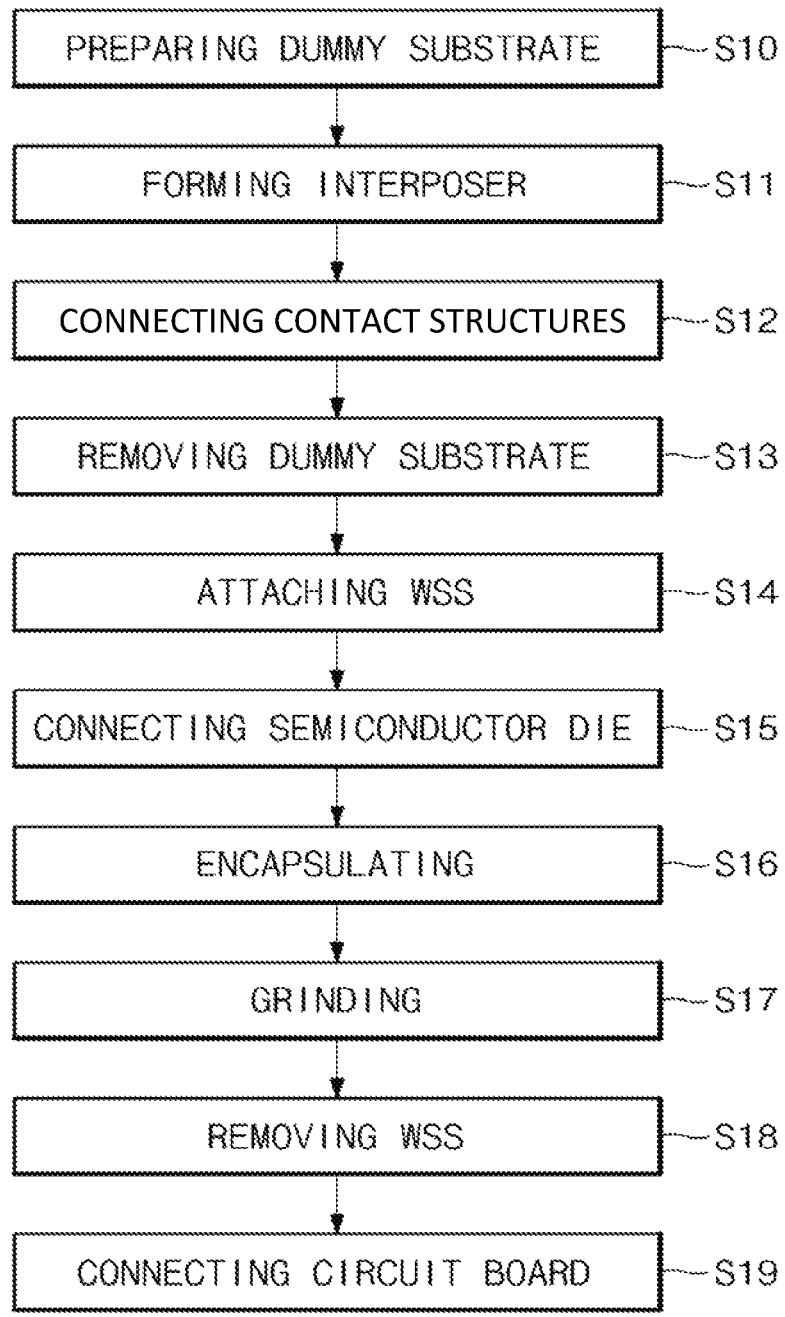
FIG. 1 is a flowchart illustrating an example method for manufacturing a semiconductor device, in accordance with various aspects of the present disclosure.

Various aspects of this disclosure provide a semiconductor device structure and a method for manufacturing a semiconductor device. As a non-limiting example, various aspects of this disclosure provide a method for manufacturing a semiconductor device that comprises ordering and performing processing steps in a manner that prevents warpage deformation from occurring to a wafer and/or die due to mismatching thermal expansion coefficients.

DETAILED DESCRIPTION OF VARIOUS ASPECTS OF THE DISCLOSURE

The following discussion presents various aspects of the present disclosure by providing various examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

FIG. 1 is a flowchart illustrating an example method for manufacturing a semiconductor device, in accordance with various aspects of the present disclosure.

Referring to FIG. 1, the example method of manufacturing a semiconductor device may, for example, comprise preparing a dummy substrate (S10), forming an interposer (S11), connecting contact structures (S12), removing the dummy substrate (S13), attaching a wafer support system (WSS) (S14), connecting a semiconductor die (S15), encapsulating (S16), grinding (S17), removing the WSS (S18) and connecting a circuit board (S19).

The example manufacturing method of FIG. 1 will now be described in more detail with reference to FIGS. 2A to 2K.

FIGS. 2A to 2K show cross-sectional views illustrating various aspects of the example method shown in FIG. 1. It should be noted that FIGS. 2A to 2K merely provide examples of various aspects of the method shown in FIG. 1. Accordingly, the scope of various aspects of the method should not be limited by the example illustrations of FIGS. 2A to 2K.

Figure 2A:
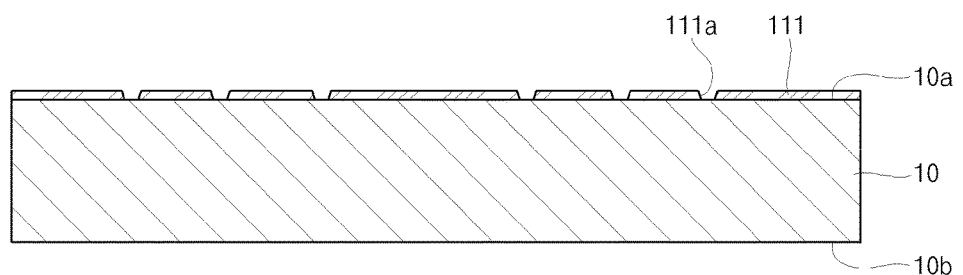
FIGS. 2A to 2K show cross-sectional views illustrating various aspects of the example method shown in FIG. 1.
Figure 2B:
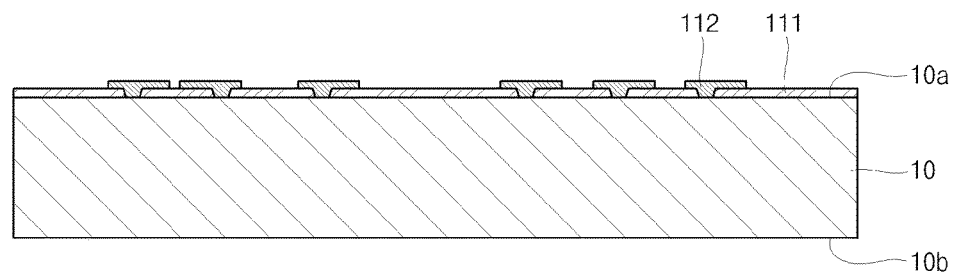
Figure 2C:
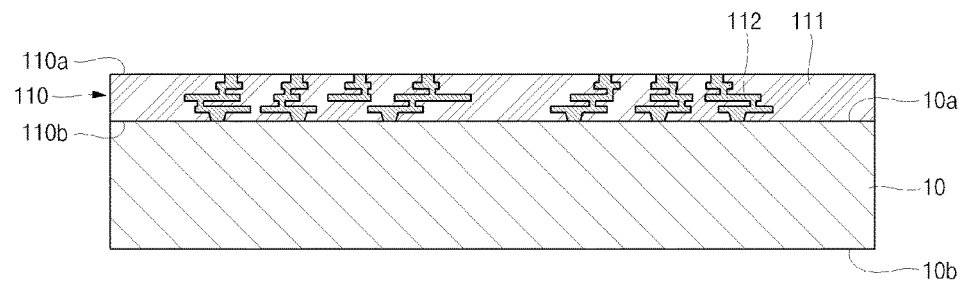

For example, FIGS. 2A to 2C provide an example illustration of forming an interposer.

First, as illustrated in FIG. 2A, a dummy substrate 10 (or temporary manufacturing substrate) is prepared, the dummy substrate 10 having a generally flat first surface 10a and a generally flat second surface 10b opposite to the first surface 10a, and a dielectric layer 111 is formed on the first surface 10a of the dummy substrate 10. The dummy substrate 10 may, for example, include one of silicon, low-grade silicon, glass (e.g., glass sheet, glass-reinforced epoxy, etc.), epoxy, silicon carbide, sapphire, quartz, ceramic, metal oxide, metal or equivalents thereof (e.g., aluminum, etc.), but aspects of the present disclosure are not limited thereto. The dielectric layer 111 may, for example, be deposited on the first surface 10a of the dummy substrate 10 using chemical vapor deposition (CVD) equipment and then patterned by a photolithographic etching process and/or a laser process, thereby forming openings 111a. Portions of the first surface 10a of the dummy substrate 10 may be exposed to the outside by the openings 111a. The dielectric layer 111 may comprise, for example, an oxide layer such as a silicon oxide layer, a silicon nitride layer, and equivalents thereof, but aspects of the present disclosure are not limited thereto.

As illustrated in FIG. 2B, a conductive redistribution layer (RDL) 112 may be formed on the openings 111a and the dielectric layer 111. Accordingly, the redistribution layer 112 may be brought into direct contact with the dummy substrate 10 through the openings 111a. The redistribution layer 112 may, for example, be formed by an electroless plating process using a seed layer made of gold, silver, nickel, titanium and/or tungsten, an electroplating process using copper, etc., and a photolithographic etching process using a photoresist, but aspects of the present disclosure are not limited thereto. In addition, the redistribution layer 112 may, for example, include not only copper but one of a copper alloy, aluminum, an aluminum alloy, iron, an iron alloy or equivalents thereof, but aspects of the present disclosure are not limited thereto.

As illustrated in FIG. 2C, the forming of the dielectric layer 111 and the forming of the redistribution layer 112 may be repeatedly performed multiple times, thereby forming an interposer 110 having a multi-layered structure. The interposer 110 may have the first surface 110a and the second surface 110b opposite to the first surface 110a, and the redistribution layer 112 may be exposed to the first surface 110a and the second surface 110b, for example through surface openings in the dielectric layer 111.

Though the interposer 110 may be formed by a fabrication (FAB) process, the present disclosure does not so limit the forming process of the interposer 110.

Figure 2D:
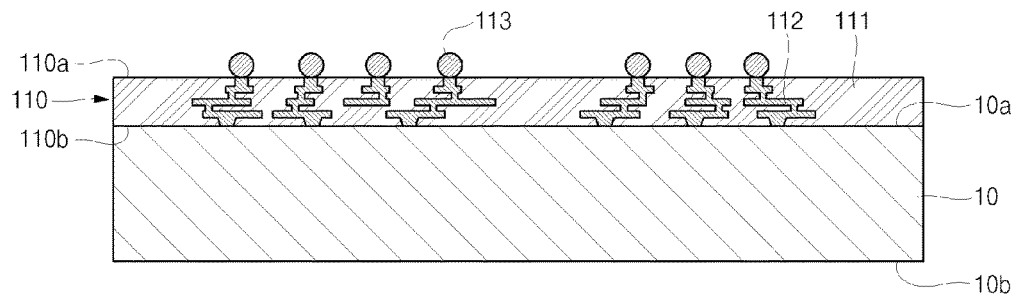

As illustrated in FIG. 2D, contact structures 113 (such as conductive bumps or balls, pillars, or other contact structures comprising solder, copper, and/or other conductive material) may further be formed on the redistribution layer 112 exposed through the first surface 110a of the interposer 110. The contact structures 113 may be formed to be easily connected to a wafer support system (WSS) 120 to be described later. The contact structures 113 are electrically connected to the redistribution layer 112 exposed through the first surface 110a of the interposer 110. For example, volatile flux may be applied to a predetermined region of the redistribution layer 112 exposed to the outside through the dielectric layer 111, and the contact structures 113 can be positioned on the flux, followed by applying heat of a temperature ranging from approximately 150° C. to approximately 250° C. or 270° C. thereby connecting the contact structures 113 to the redistribution layer 112 while allowing the flux to volatilize. Thereafter, a cooling process is performed to make the contact structures 113 mechanically/electrically connected to the redistribution layer 112.

Figure 2E:
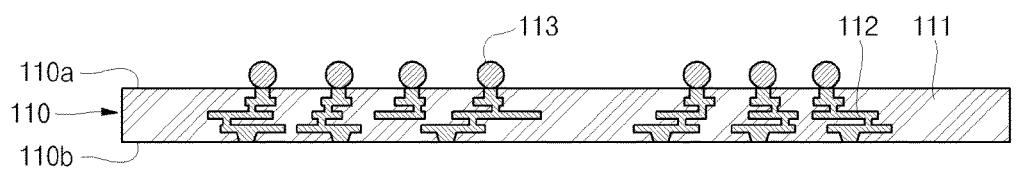

As illustrated in FIG. 2E, the dummy substrate 10 may be removed from the second surface 110b of the interposer 110. For example, the dummy substrate 10 may be removed by grinding the same by a predetermined thickness, followed by performing dry etching and/or wet etching, thereby completely removing the dummy substrate 10. As a result, the second surface 110b of the interposer 110 may be exposed. For example, the removing of the dummy substrate 10 from the second surface 110b of the interposer 110 may expose the redistribution layer 112 to the outside through the dielectric layer 111.

Figure 2F:
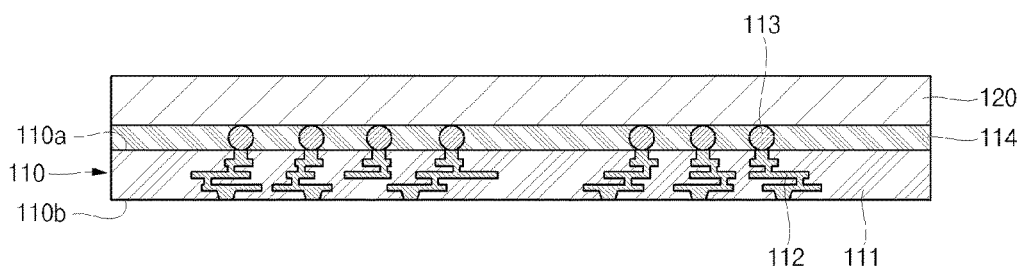

As illustrated in FIG. 2F, a wafer support system (WSS) 120, which may also be referred to as a wafer support structure, may be attached to the first surface 110a of the interposer 110. For example, the WSS 120 may be attached to the first surface 110a of the interposer 110 and the contact structures 130 connected to the first surface 110a of the interposer 110 using an adhesive 114 (or epoxy). The WSS 120 may, for example, support and fix the interposer 110 in a state in which the dummy substrate 10 is removed. The WSS 120 may, for example, be made of a general insulating material or other materials.

Figure 2G:
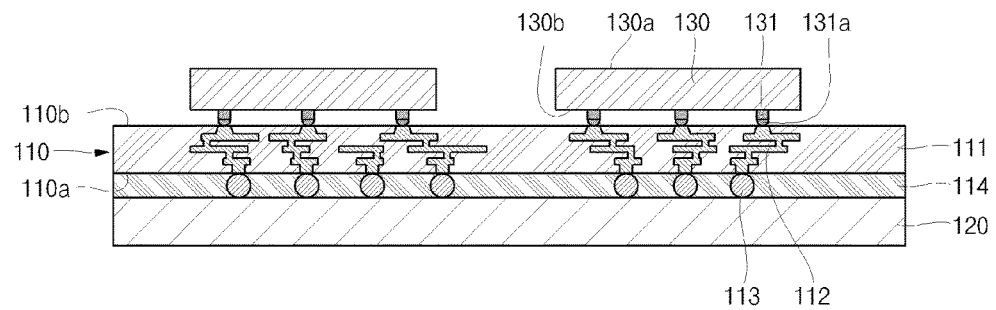

As illustrated in FIG. 2G, the semiconductor die 130 may be electrically connected to the second surface 110b of the interposer 110. Prior to this process, in a state in which the first surface 110a of the interposer 110 is attached to the WSS 120, the second surface 110b of the interposer 110 may be flipped to face upward. The semiconductor die 130 has a first surface 130a and a second surface 130b opposite to the first surface 130a, and a die contact 131 is provided on the second surface 130b. The semiconductor die 130 is electrically connected to the redistribution layer 112 formed on the second surface 110b of the interposer 110 through the die contact 131. For example, the semiconductor die 130 may be connected to the interposer 110 in a flip chip configuration. The die contact 131 may, for example, further include a solder cap 131a formed at its end to facilitate a connection with the interposer 110. The die contact 131 may, for example, generally include a conductive structure formed on and/or attached to bond pads on the die 130 (e.g., a bump on a bumped die, etc.).

Figure 2H:
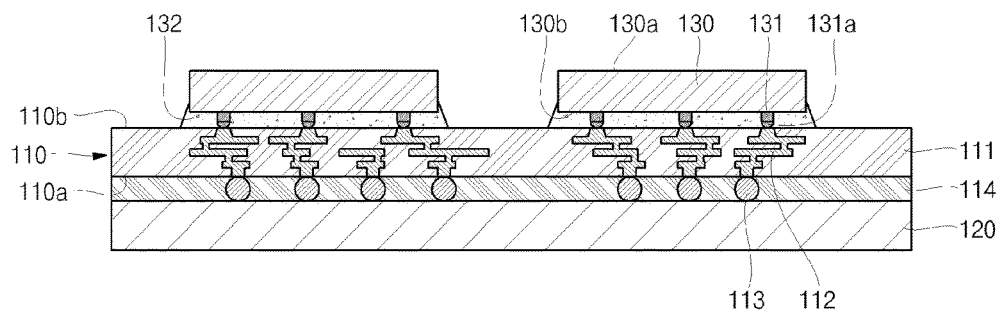

As illustrated in FIG. 2H, an underfill 132 may be injected into a space between the semiconductor die 130 and the interposer 110, followed by hardening. For example, the underfill 132 may be interposed between the second surface 130b of the semiconductor die 130 and the second surface 110b of the interposer 110 and may be formed to cover the die contact 131 and the exposed redistribution layer 112. The semiconductor die 130 may, for example, be more stably fixed on the interposer 110 by the underfill 132 such that the semiconductor die 130 and the interposer 110 are not electrically disconnected from each other in spite of a difference in respective thermal expansion coefficients. In some cases, if a filler diameter of the encapsulant 140 (to be described later) is smaller than a gap between the semiconductor die 130 and the interposer 110, the encapsulant 140 can be formed in the gap between the semiconductor die 130 and the interposer 110. In such a scenario, a separate underfill 131 might not be utilized, or encapsulant 140 can comprise underfill 131.

Figure 2I:
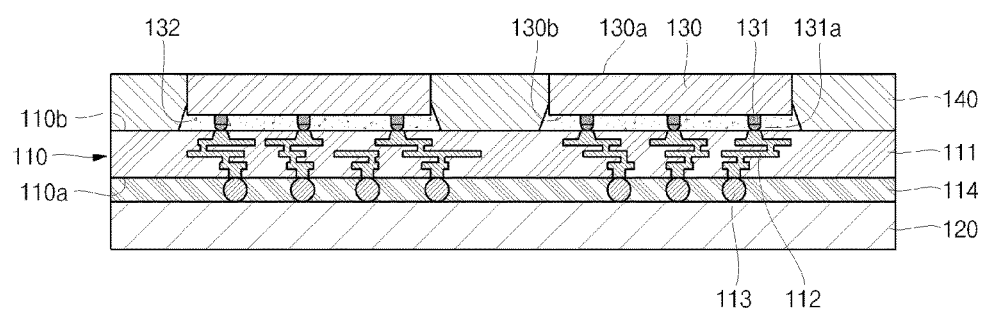

As illustrated in FIG. 2I, the interposer 110 and the semiconductor die 130 may be encapsulated by the encapsulant 140. The encapsulant 140 may, for example, be formed to entirely cover the second surface 110b of the interposer 110 and the semiconductor die 130. Such covering may then, for example if exposure of the semiconductor die 130 is desired, be followed by back grinding and/or etching or otherwise thinning (if needed) to allow the first surface 130a of the semiconductor die 130 to be exposed from the encapsulant 140. The interposer 110 and the semiconductor die 130 may be protected from external circumstances by the encapsulant 140. The encapsulant 140 may, for example, include general epoxy, paste, molding compound, and equivalents thereof, but is not limited thereto.

Figure 2J:
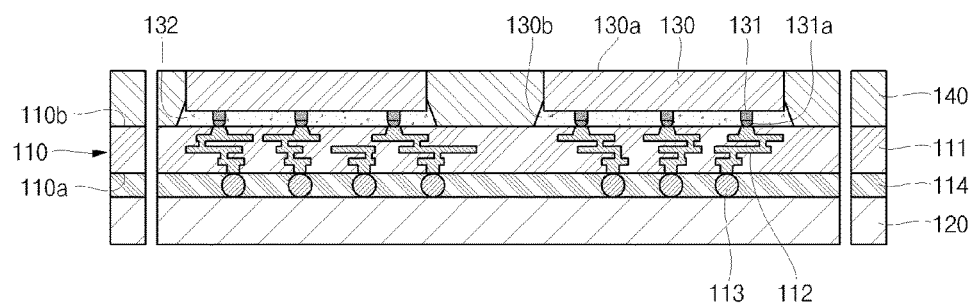

As illustrated in FIG. 2J the interposer 110 and the encapsulant 140 may be diced to be divided into discrete semiconductor modules. The dicing may, for example, be performed by blade dicing, laser dicing, or using any of a variety of dicing tools, but aspects of the present disclosure are not limited thereto. Here, the semiconductor module refers to an interposer having one or more semiconductor dies 130 mounted thereon and encapsulated by the encapsulant 140. For example, the interposer having the semiconductor dies 130 mounted thereon may be divided into individual semiconductor module units. In FIG. 2J, two semiconductor dies 130 included in the semiconductor module are illustrated. However, only one or more than two semiconductor dies 130 might be included in the semiconductor module, and the present disclosure does not limit the number of semiconductor dies included per semiconductor module.

Figure 2K:
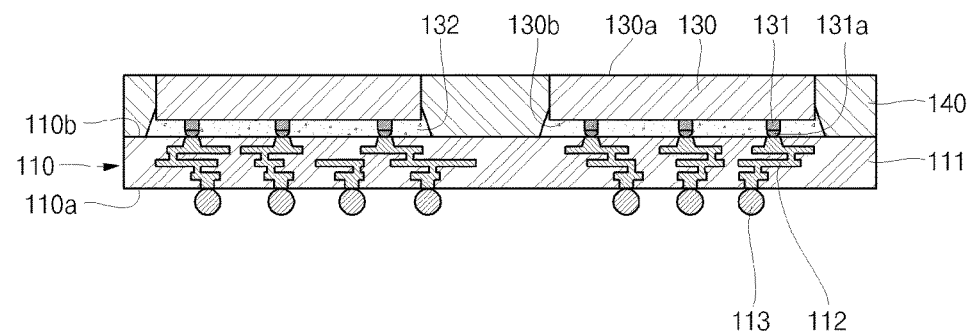

As illustrated in FIG. 2K, a semiconductor device including semiconductor modules each formed by dicing the interposer 110 and the encapsulant 140, may be completed. The WSS 120 and adhesive 114 may be removed, for example by mechanical and/or electrical means. Note that although FIG. 2J shows the dicing occurring through the WSS 120, in another example the dicing may penetrate the interposer 110 but not the WSS 120, which may later be re-used. The completed semiconductor device may be mounted to be electrically connected (e.g., directly connected) to a printed circuit board (PCB) (or wafer, other semiconductor device, die, etc.) through the contact structures 113 formed on the first surface 110a of the interposer 110. Note that the WSS 120 and adhesive 114 may be removed prior to the dicing shown in FIG. 2J and/or the dicing may leave the WSS 120 intact. Such an operation may, for example, allow the WSS 120 to be reused.

As described above, according to this example, the semiconductor device including multiple redistribution layers is completed. In addition, the semiconductor device completed according to this embodiment may have another semiconductor device, package or component further mounted thereto.

As described above, according to this embodiment, the placement and encapsulating of the semiconductor die 130 via encapsulant 140 is arranged as a later or final process in the manufacturing method of the semiconductor device, for example after the formation of interposer 110, thereby providing a semiconductor device having suppressed wafer warpage deformation due to a difference in the thermal expansion coefficient between the semiconductor die 130 and the redistribution layer 112.

Figure 3:
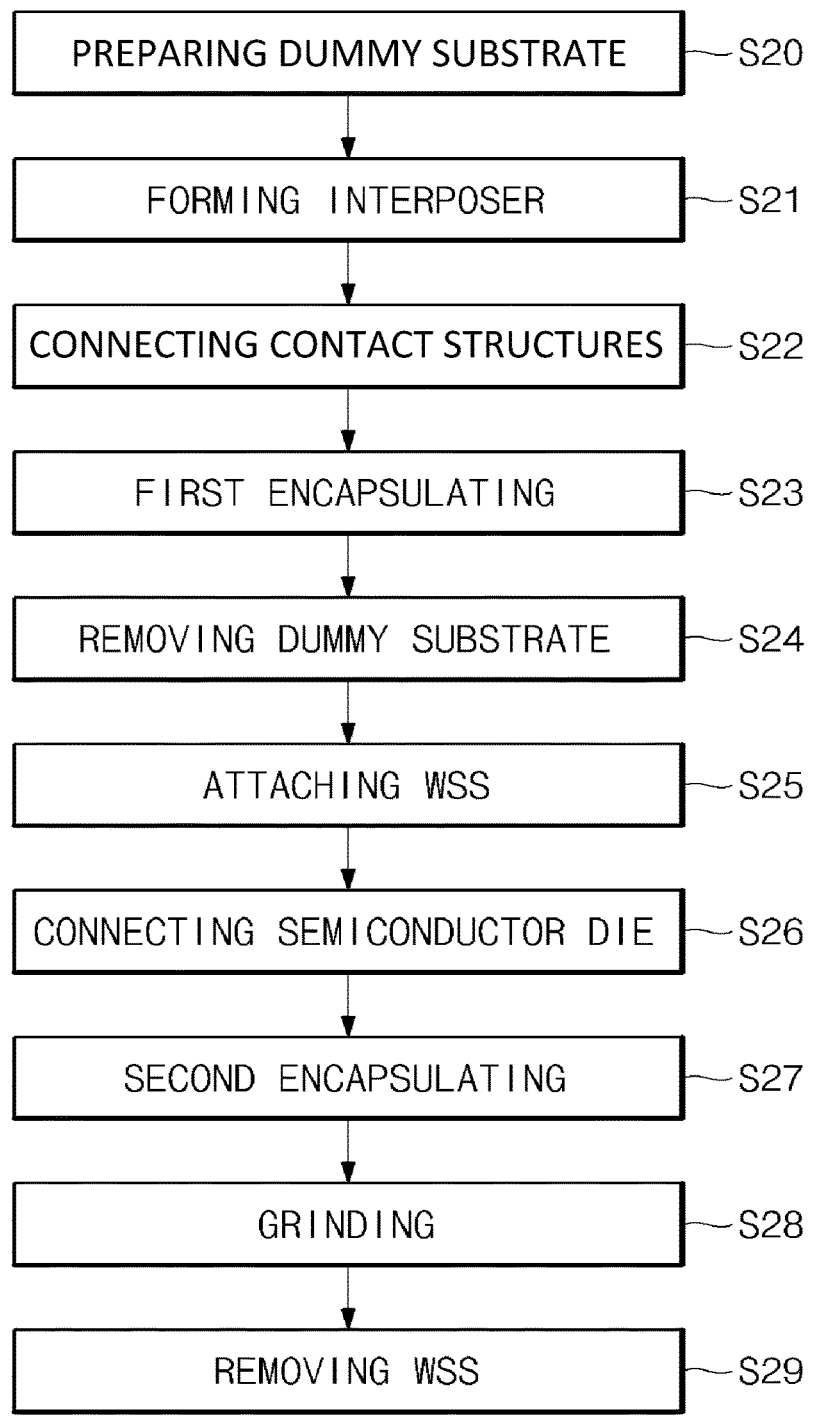
FIG. 3 is a flowchart illustrating an example method for manufacturing a semiconductor device, in accordance with various aspects of the present disclosure.

FIG. 3 is a flowchart illustrating an example method for manufacturing a semiconductor device, in accordance with various aspects of the present disclosure.

Referring to FIG. 3, the example method of manufacturing a semiconductor device may, for example, comprise preparing a dummy substrate (S20), forming an interposer (S21), connecting contact structures (S22), first encapsulating (S23), removing the dummy substrate (S24), attaching a wafer support system (WSS) (S25), connecting a semiconductor die (S26), second encapsulating (S27), grinding (S28) and removing the WSS (S29). The example method of FIG. 3 may, for example, share any or several aspects or elements with the example methods of FIGS. 1-2 discussed previously and/or with any method discussed herein.

The example manufacturing method of FIG. 3 will now be described in more detail with reference to FIGS. 4A to 4L. It should be noted that FIGS. 4A to 4L merely provide examples of various aspects of the method 300. Accordingly, the scope of various aspects of the method 300 should not be limited by the example illustrations of FIGS. 4A to 4L.

FIGS. 4A to 4L are cross-sectional views illustrating various aspects of the example method shown in FIG. 3.

For example, FIGS. 4A to 4L provide an example illustration of forming an interposer.

Figure 4A:
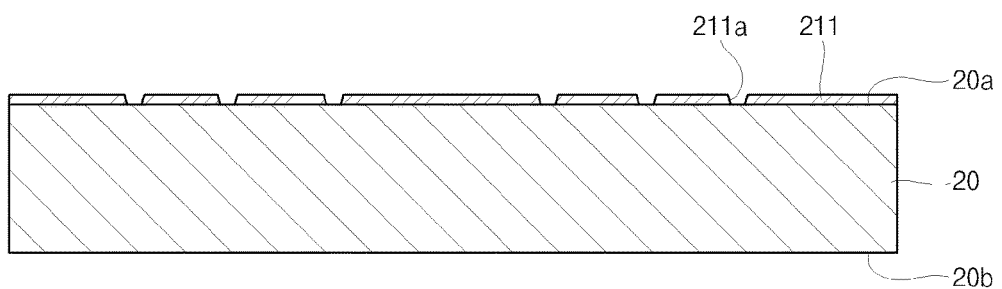
FIGS. 4A to 4L show cross-sectional views illustrating various aspects of the example method shown in FIG. 3.

First, as illustrated in FIG. 4A, a dummy substrate 20 (or temporary manufacturing substrate) is prepared, the dummy substrate 20 having a generally flat first surface 20a and a generally flat second surface 20b opposite to the first surface 20a, and a dielectric layer 211 is formed on the first surface 20a of the dummy substrate 20. The dummy substrate 20 may, for example, include one of silicon, low-grade silicon, glass, silicon carbide, sapphire, quartz, ceramic, metal oxide, metal or equivalents thereof, but aspects of the present disclosure are not limited thereto. The dielectric layer 211 may, for example, be deposited on the first surface 20a of the dummy substrate 20 using chemical vapor deposition (CVD) equipment and then patterned by a photolithographic etching process and/or a laser process, thereby forming openings 211a. Portions of the first surface 20a of the dummy substrate 20 may be exposed by the openings 211a. The dielectric layer 211 may, for example, include an oxide layer such as a silicon oxide layer, a silicon nitride layer, or equivalents thereof, but aspects of the present disclosure are not limited thereto.

Figure 4B:
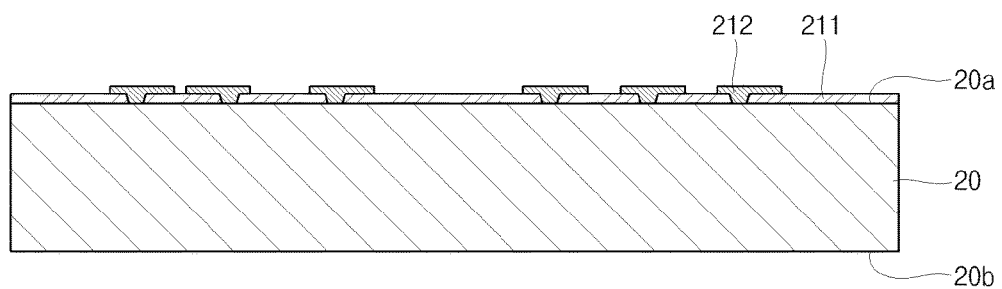

As illustrated in FIG. 4B, a conductive redistribution layer (RDL) 212 may be formed on the openings 211a and the dielectric layer 211. Accordingly, the redistribution layer 212 may be brought into direct contact with the dummy substrate 20 through the openings 211a. The redistribution layer 212 may, for example, be formed by an electroless plating process using a seed layer made of gold, silver, nickel, titanium and/or tungsten, an electroplating process using copper, etc., and a photolithographic etching process using a photoresist, but aspects of the present disclosure are not limited thereto. In addition, the redistribution layer 212 may, for example, include not only copper but one of a copper alloy, aluminum, an aluminum alloy, iron, an iron alloy or equivalents thereof, but aspects of the present disclosure are not limited thereto.

Figure 4C:
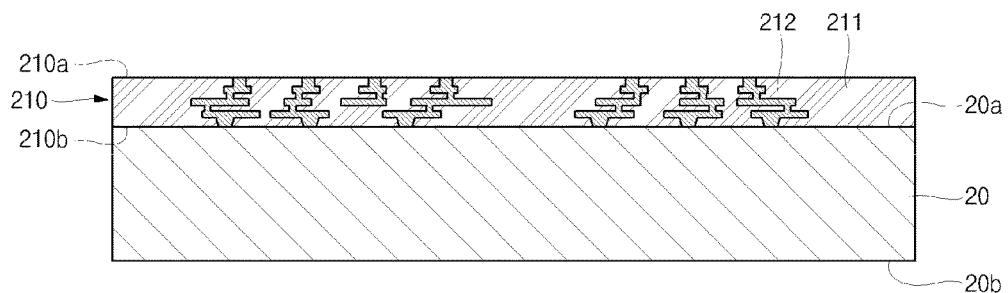

As illustrated in FIG. 4C, the forming of the dielectric layer 211 and the forming of the redistribution layer 212 may be repeatedly performed multiple times, thereby forming an interposer 210 having a multi-layered structure. The interposer 210 may have the first surface 210a and the second surface 210b opposite to the first surface 210a, and the redistribution layer 212 may be exposed to the first surface 210a and the second surface 210b, for example through surface openings in the dielectric layer 211.

Though the interposer 210 may be formed by a fabrication (FAB) process, the present disclosure does not so limit the forming process of the interposer 210.

Figure 4D:
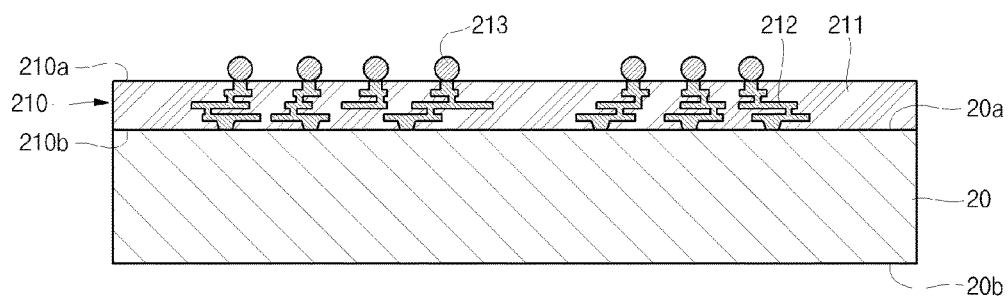

As illustrated in FIG. 4D, contact structures 213 (such as conductive bumps, balls, pillars, or other contact structures comprising solder, copper, and/or other conductive material) may further be formed on the redistribution layer 212 exposed through the first surface 210a of the interposer 210. The contact structures 213 may be formed to be easily connected to a wafer support system (WSS) 220 to be described later. The contact structures 213 are electrically connected to the redistribution layer 212 exposed through the first surface 210a of the interposer 210. For example, volatile flux may be applied to a predetermined region of the redistribution layer 112 exposed to the outside through the dielectric layer 111, and the contact structures 113 are positioned on the flux, followed by applying heat of a temperature ranging from approximately 150° C. to approximately 250° C. or 270° C., thereby connecting the contact structures 113 to the redistribution layer 112 while allowing the flux to volatilize. Thereafter, a cooling process is performed to make the contact structures 113 mechanically/electrically connected to the redistribution layer 112.

Figure 4E:
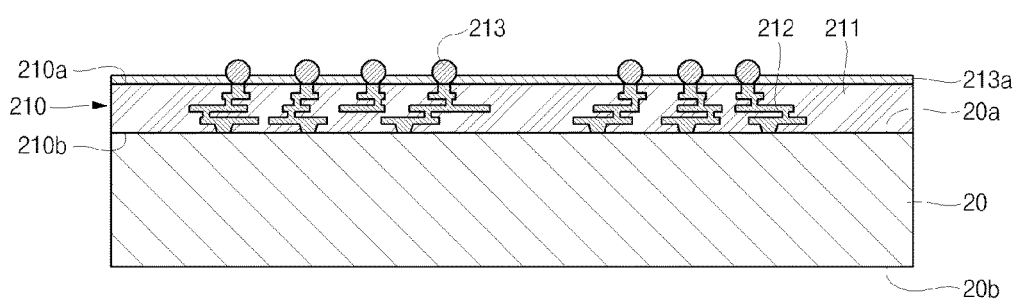

As illustrated in FIG. 4E, the first surface 210a of the interposer 210 between the contact structures 213 may be encapsulated by a first encapsulant 213a. The first encapsulant 213a may, for example, be formed to have a smaller thickness than a second encapsulant 240 to be described later. The first encapsulant 213a may, for example, be formed to have a smaller thickness than a radius (e.g., a typical or average radius) of the contact structures 213. Also for example, the first encapsulant 213a may, for example, be formed to have a thickness that is between a radius and a diameter of the contact structures 213. The first encapsulant 213a may, for example, prevent or reduce wafer warpage deformation due to a difference in the respective thermal expansion coefficients of the contact structures 213 and the redistribution layer 212. In addition, the first encapsulant 213a may protect the interposer 210 from external circumstances.

Figure 4F:
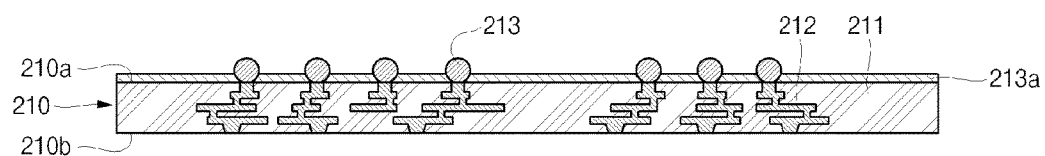

As illustrated in FIG. 4F, the dummy substrate 20 may be removed from the second surface 210b of the interposer 210. For example, the dummy substrate 20 may be removed by grinding the same by a predetermined thickness, followed by performing dry etching and/or wet etching, thereby completely removing the dummy substrate 10. As the result of the removing of the dummy substrate 20, the second surface 210b of the interposer 210 may be exposed. For example, the removing of the dummy substrate 20 from the second surface 210b of the interposer 210 may expose the redistribution layer 212 through the dielectric layer 211.

Figure 4G:
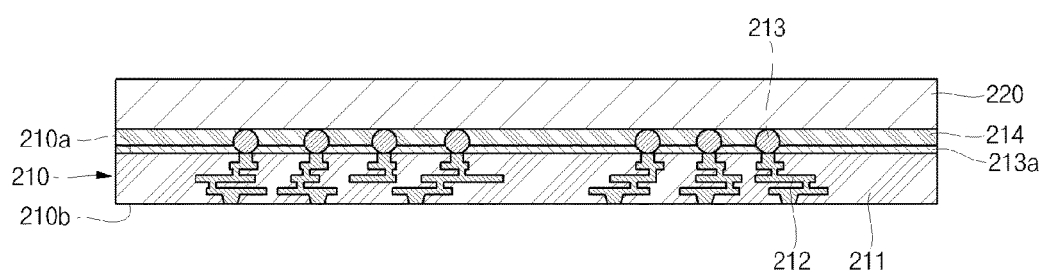

As illustrated in FIG. 4G, a wafer support system (WSS) 220, which may also be referred to as a wafer support structure, may be attached to the first surface 210a of the interposer 210. For example, the WSS 220 may be attached to the first surface 210a of the interposer 210 and the contact structures 213 connected to the first surface 210a of the interposer 210 using an adhesive 214 (or epoxy). The WSS 220 may, for example, support and fix the interposer 210 in a state in which the dummy substrate 20 is removed. The WSS 220 may, for example, be made of a general insulating material or other materials.

Figure 4H:
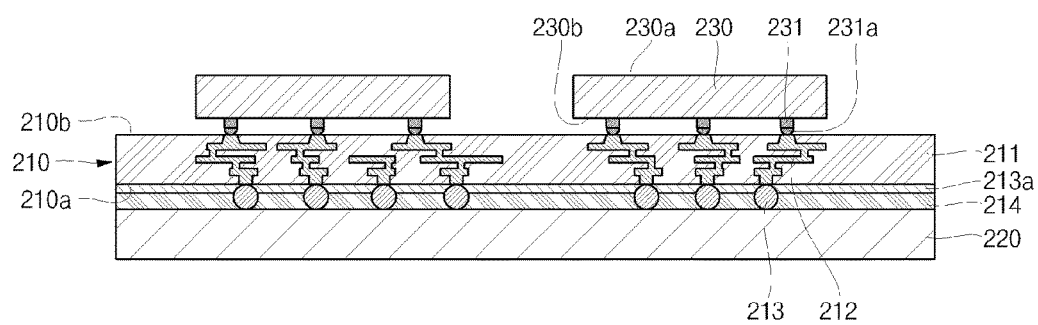

As illustrated in FIG. 4H, the semiconductor die 230 may be electrically connected to the second surface 210b of the interposer 210. Prior to this process, in a state in which the first surface 210a of the interposer 210 is attached to the WSS 220, the second surface 210b of the interposer 210 may be flipped to face upward. The semiconductor die 230 has a first surface 230a and a second surface 230b opposite to the first surface 230a, and a die contact 231 may be provided on the second surface 230b. The semiconductor die 230 may, for example, be electrically connected to the redistribution layer 212 formed on the second surface 210b of the interposer 210 through the die contact 231. For example, the semiconductor die 230 may be connected to the interposer 210 in a flip chip configuration. The die contact 231 may, for example, further include a solder cap 231a formed at its end to facilitate a connection with the interposer 210. The die contact 131 may, for example, generally include a conductive structure formed on and/or attached to bond pads on the die 130 (e.g., a bump on a bumped die, etc.).

Figure 4I:
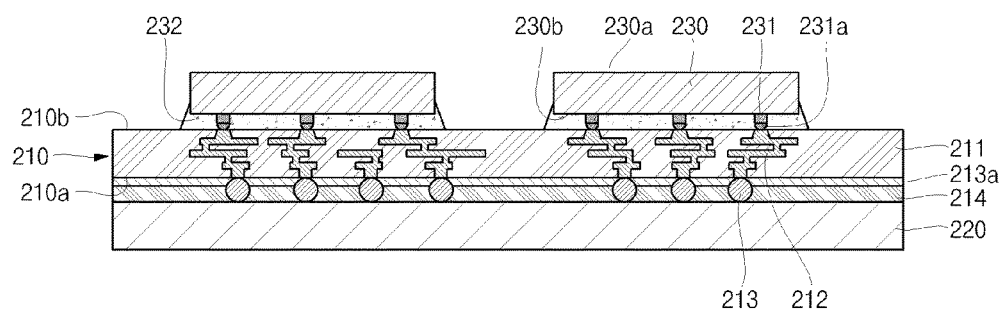

As illustrated in FIG. 4I, an underfill 232 may be injected into a space between the semiconductor die 230 and the interposer 210, followed by hardening. For example, the underfill 232 may be interposed between the second surface 230b of the semiconductor die 230 and the second surface 210b of the interposer 210 and may be formed to cover the die contact 231 and the exposed redistribution layer 212. The semiconductor die 230 may, for example, be more stably fixed on the interposer 210 by the underfill 232 such that the semiconductor die 230 and the interposer 210 are not electrically disconnected from each other in spite of a difference in respective thermal expansion coefficients. In some cases, if a filler diameter of the encapsulant 240 to be described later is smaller than a gap between the semiconductor die 230 and the interposer 210, the encapsulant 240 can be formed in the gap between the semiconductor die 230 and the interposer 210. In such a scenario, a separate underfill 231 might not be utilized, or encapsulant 240 can comprise underfill 231.

Figure 4J:
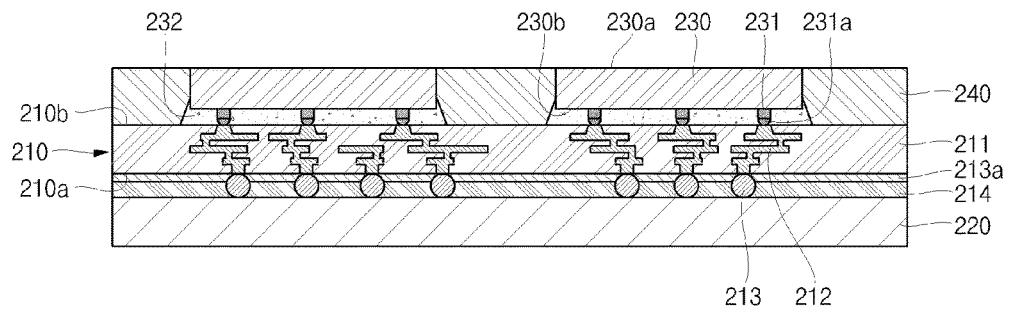

As illustrated in FIG. 4J, the interposer 210 and the semiconductor die 230 may be encapsulated by the encapsulant 240. The encapsulant 240 may, for example, be formed to entirely cover the second surface 210b of the interposer 210 and the semiconductor die 230. Such covering may then, for example if exposure of the semiconductor die 230 is desired, be followed by back grinding and/or etching or otherwise thinning (if needed) to allow the first surface 230a of the semiconductor die 230 to be exposed from the encapsulant 240. The interposer 210 and the semiconductor die 230 may be protected from external circumstances by the encapsulant 240. The encapsulant 240 may, for example, include general epoxy, paste, molding compound, and equivalents thereof, but is not limited thereto.

Figure 4K:
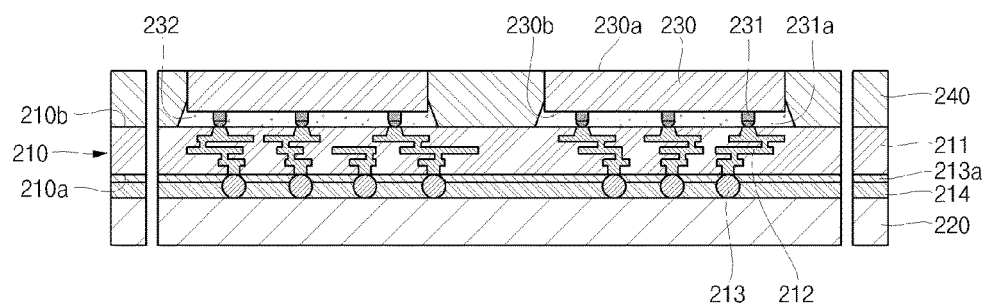

As illustrated in FIG. 4K, the interposer 210 and encapsulant 240 may be diced to be divided into discrete semiconductor modules. The dicing may, for example, be performed by blade dicing, laser dicing, or using any of a variety of dicing tools, but aspects of the present disclosure are not limited thereto. Here, the semiconductor module refers to an interposer having one or more semiconductor dies 230 mounted thereon and encapsulated by the encapsulant 240. For example, the interposer having the semiconductor dies 230 mounted thereon may be divided into individual semiconductor module units. In FIG. 4K, two semiconductor dies 230 included in the semiconductor module are illustrated. However, only one or more than two semiconductor dies 230 might be included in the semiconductor module, and the present disclosure does not limit the number of semiconductor dies included per semiconductor module.

Figure 4L:
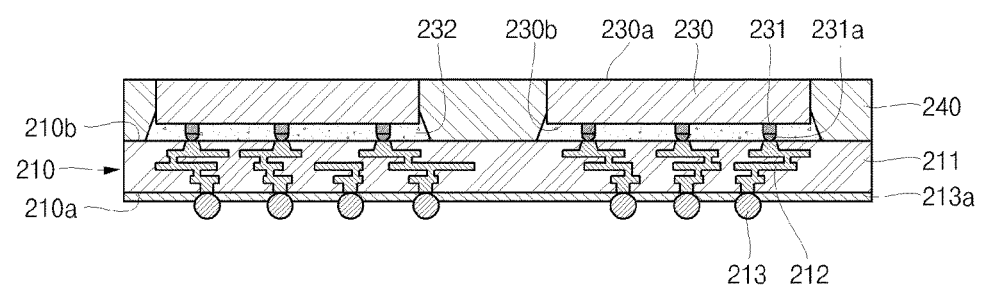

As illustrated in FIG. 4L a semiconductor device including semiconductor modules each formed by dicing the interposer 210 and the encapsulant 240, may be completed. The completed semiconductor device may be mounted to be electrically connected (e.g., directly connected) to a wafer (or PCB, other semiconductor device, die, etc.) through the contact structures 213 formed on the first surface 210a of the interposer 210. Note that the WSS 220 and adhesive 214 may be removed prior to the dicing shown in FIG. 4K and/or the dicing may leave the WSS 220 intact. Such an operation may, for example, allow the WSS 220 to be reused.

As described above, according to this example, the encapsulating may be performed on each of the first surface 210a of the interposer 210 and the second surface 210b of the interposer 210, thereby providing a semiconductor device having suppressed wafer warpage deformation due to a difference in the thermal expansion coefficient between the semiconductor die 230 or the contact structures 213 and the redistribution layer 212.

FIGS. 5A to 5J show cross-sectional views illustrating various aspects of an example method for manufacturing a semiconductor device, in accordance with various aspects of the present disclosure. The example method aspects of FIG. 5 may, for example, share any or several aspects or elements with the example method aspects of FIGS. 1-4 discussed previously and/or with any method discussed herein.

Figure 5A:
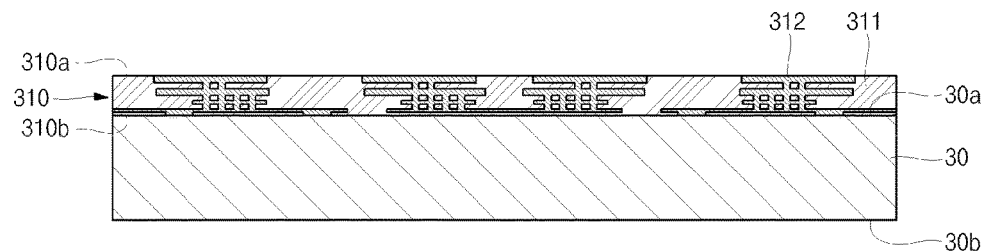
FIGS. 5A to 5J show cross-sectional views illustrating various aspects of an example method for manufacturing a semiconductor device, in accordance with various aspects of the present disclosure.

As illustrated in FIG. 5A, a first dummy substrate 30 is prepared, the first dummy substrate 30 having a generally flat first surface 30a and a generally flat second surface 30b opposite to the first surface 30a, and a first interposer 310 may be formed on the first surface 30a of the first dummy substrate 30. The first interposer 310 includes a first dielectric layer 311 and a first redistribution layer 312. The first interposer 310, for example having a multi-layered structure, may be completed by repeatedly performing the forming of the first dielectric layer 311 and the forming of the first redistribution layer 312 multiple times (e.g., repeatedly forming respective portions thereof). The first interposer 310 may have a first surface 310a and a second surface 310b opposite to the first surface 310a, and the first redistribution layer 312 may be exposed to the first surface 310a and the second surface 310b (e.g., through openings in the first dielectric layer 311).

Figure 5B:
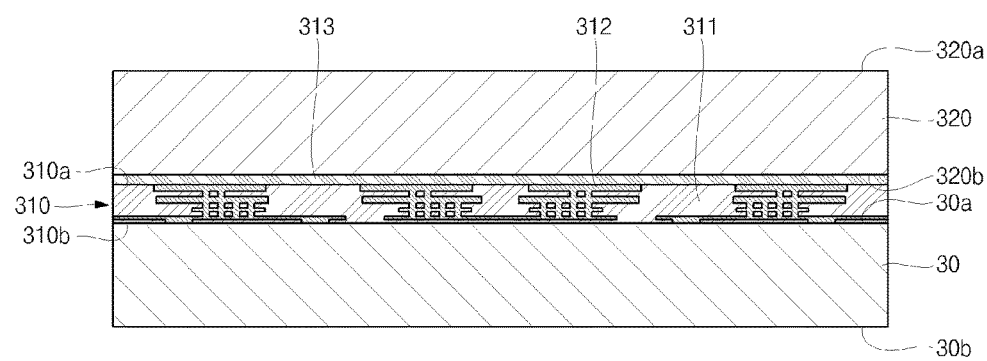

As illustrated in FIG. 5B, a first WSS 320 may be attached to the first surface 310a of the first interposer 310. For example, the first WSS 320 may be attached to the first surface 310a of the first interposer 310 using a first adhesive 313 (or epoxy). The first WSS 320 may support and fix the interposer 310 in a state in which the first dummy substrate 30 is removed. The first WSS 320 may have a first surface 320a and a second surface 320b opposite to the first surface 320a and adhered to the first adhesive 313.

Figure 5C:
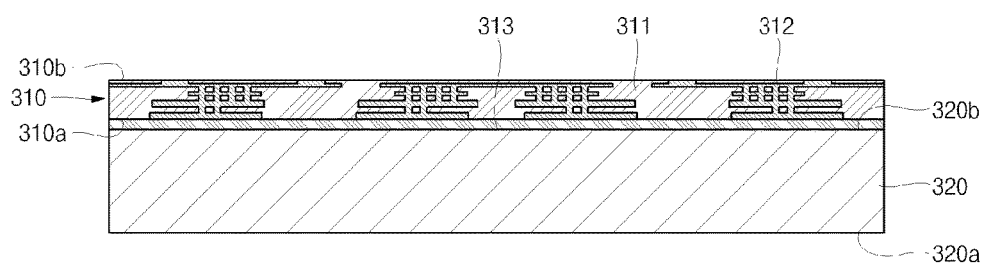

As illustrated in FIG. 5C, the first dummy substrate 30 may be removed from the second surface 310b of the first interposer 310. Prior to this process, in a state in which the first surface 310a of the first interposer 310 is attached to the WSS 320, the second surface 310b of the interposer 310 may be flipped to face upward. The first dummy substrate 30 may then be removed by grinding the same by a predetermined thickness, followed by performing dry etching and/or wet etching, thereby completely removing the first dummy substrate 30. As a result, the second surface 310b of the first interposer 310 may be exposed to the outside.

Figure 5D:
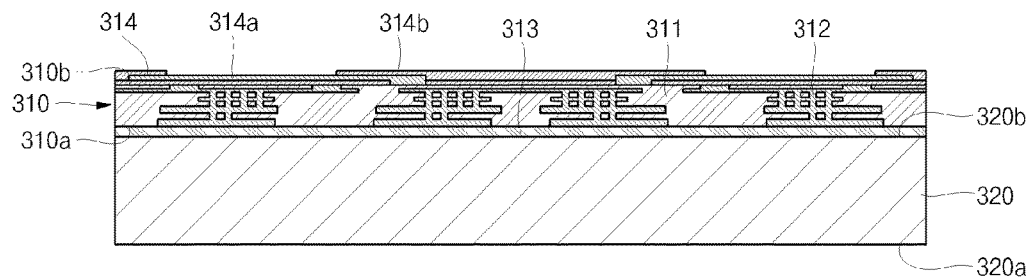

As illustrated in FIG. 5D, a second interposer 314 may be formed on the second surface 310b of the first interposer 310. The second interposer 314 includes a second dielectric layer 314b and a conductive second redistribution layer 314a. The second redistribution layer 314a may, for example, be formed as a redistribution layer having a relatively large width relative to general connecting traces (e.g., defined as a pad or a land as well).

Figure 5E:
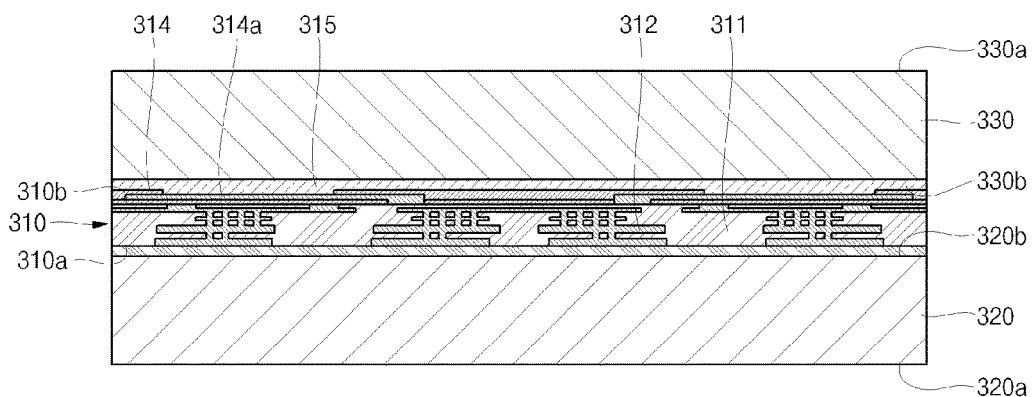

As illustrated in FIG. 5E, a second WSS 330 may be attached to an exposed surface (e.g., a top surface) of the second interposer 314. For example, the second WSS 330 may be attached to the exposed surface of the second interposer 314 using a second adhesive 315. The second WSS 330 may, for example, support and fix the first interposer 310 and the second interposer 314 in a state in which the first WSS 320 is removed.

Figure 5F:
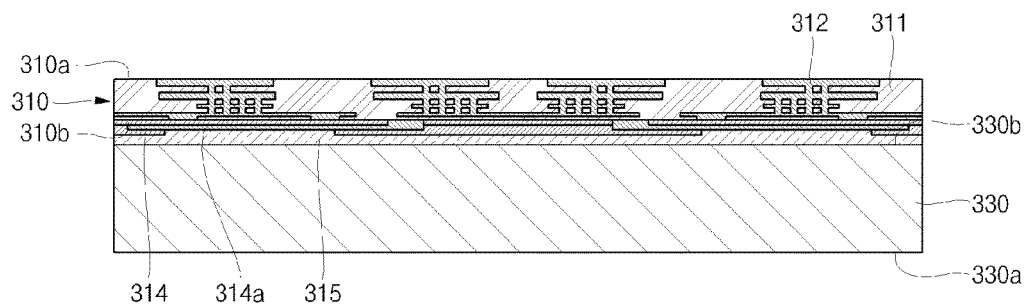

As illustrated in FIG. 5F, the first WSS 320 may be removed from the first surface 310a of the first interposer 310. Prior to this process, in a state in which the second WSS 330 is attached to the one surface (e.g., the top surface) of the second interposer 314, the first surface 310a of the first interposer 310 may be flipped to face upward. Then, the first WSS 320 may be removed by grinding the same by a predetermined thickness, followed by performing dry etching and/or wet etching, thereby completely removing the first WSS 320. As a result, the first surface 310a of the first interposer 310 is exposed to the outside (e.g., as it was also shown back at FIG. 5A). Note that other techniques for WSS removal may also be utilized in the WSS-removal steps discussed herein. For example, the first adhesive 313 may be photochemically unzipped (e.g., prior to bonding the second WSS 330.

Figure 5G:
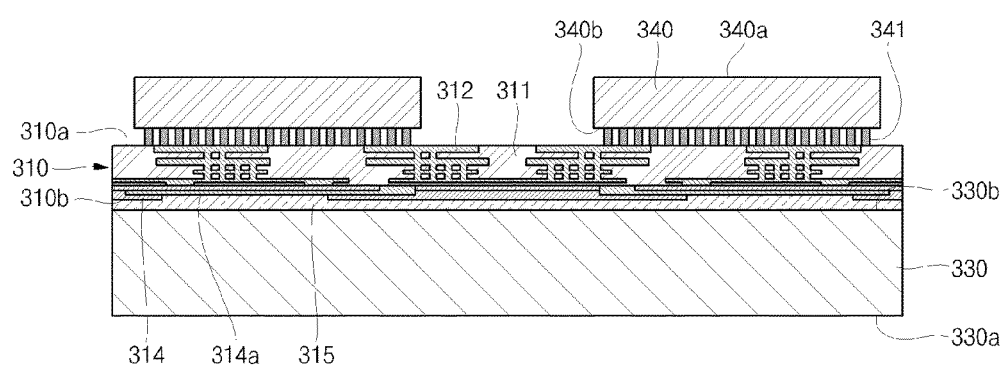

As illustrated in FIG. 5G, the semiconductor die(s) 340 may be electrically connected to the first surface 310a of the first interposer 310. The semiconductor die 340 has a first surface 340a and a second surface 340b opposite to the first surface 340a, and a die contact 341 may be provided on the second surface 340b. The semiconductor die 340 may, for example, be electrically connected to the first redistribution layer 312 formed on the first surface 310a of the first interposer 310 through the die contact 341. For example, the semiconductor die 340 may be connected to the first interposer 310 in a flip chip configuration. The die contact 341 may, for example, further include a solder cap (not shown) formed at its end to facilitate a connection with the first interposer 310. The die contact 341 may, for example, generally include a conductive structure formed on and/or attached to bond pads on the die 340 (e.g., a bump on a bumped die, etc.).

Figure 5H:
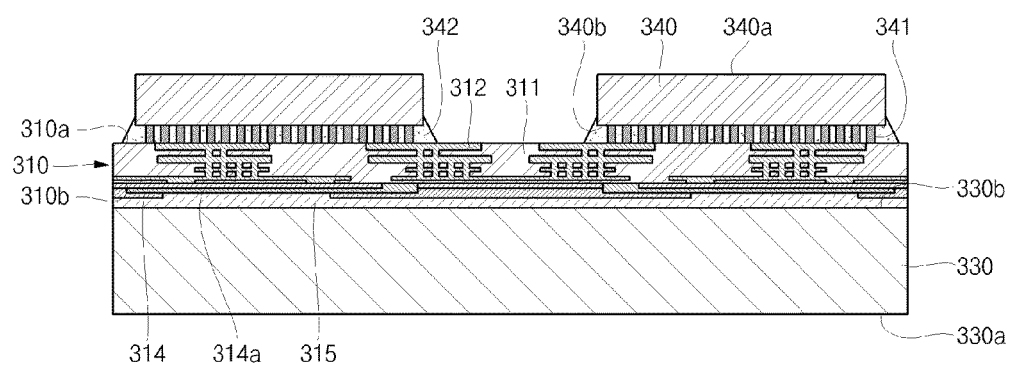

As illustrated in FIG. 5H, an underfill 342 may be injected into a space between the semiconductor die 340 and the first interposer 310, followed by hardening. For example, the underfill 342 may be interposed between the second surface 340b of the semiconductor die 340 and the first surface 310a of the first interposer 310 and may be formed to cover the die contact 341 and the exposed redistribution layer 312. The semiconductor die 340 may, for example, be more stably fixed on the first interposer 310 by the underfill 342 such that the semiconductor die 340 and the first interposer 310 are not electrically disconnected from each other in spite of a difference in respective thermal expansion coefficients. In some cases, if a filler diameter of the encapsulant 350 to be described later is smaller than a gap between the semiconductor die 340 and the first interposer 310, the encapsulant 350 can be formed in the gap between the semiconductor die 340 and the first interposer 310. In such a scenario, a separate underfill 342 might not be utilized, or encapsulant 350 can comprise underfill 342. Note that in any of the underfilling steps discussed herein, the underfilling need not be performed by dispensing or injecting the underfill after die attachment. For example, the underfill may be pre-applied in a film or liquid form prior to die attachment.

Figure 5I:
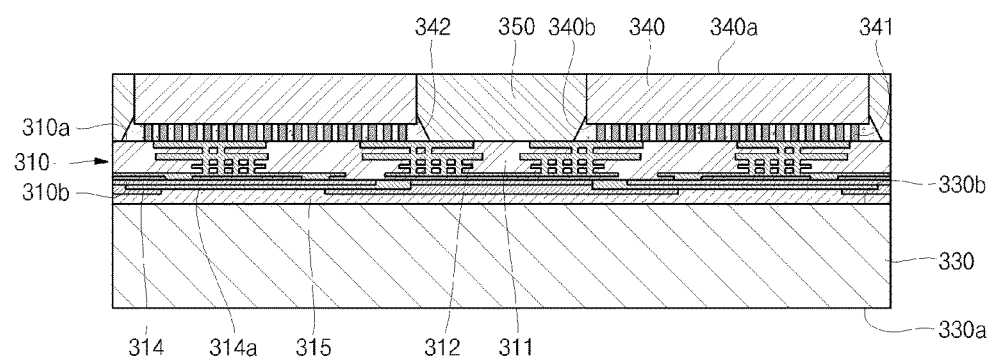

As illustrated in FIG. 5I, the first interposer 310 and the semiconductor die 340 may be encapsulated by the encapsulant 350. The encapsulant 350 may, for example, be formed to entirely cover the first surface 310a of the first interposer 310 and the semiconductor die 340. Such covering may then, for example if exposure of the semiconductor die 340 is desired, be followed by back grinding and/or etching or otherwise thinning (if needed) to allow the first surface 340a of the semiconductor die 340 to be exposed from the encapsulant 350. The first interposer 310 and the semiconductor die 340 may be protected from external circumstances by the encapsulant 350. The encapsulant 350 may, for example, include general epoxy, paste, molding compound, and equivalents thereof, but is not limited thereto.

Figure 5J:
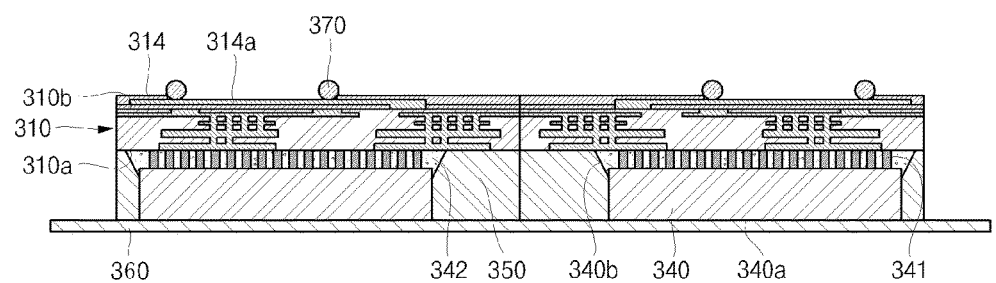

As illustrated in FIG. 5J, the second WSS 330 attached to the surface of the second interposer 314 may be removed and the exposed first surface 340a of the semiconductor die 340 (or encapsulant above the semiconductor die 340 if present) may be attached to a second dummy substrate 360. Contact structures 370 (such as conductive bumps, pillars, balls, or other contact structures comprising solder, copper, and/or other conductive material) may be formed on the second redistribution layer 314a exposed to the surface of the second interposer 314. For example, the contact structures 370 may be electrically connected to the second redistribution layer 314a exposed to the first surface of the second interposer 314 (e.g., exposed through openings in the second dielectric layer 314b). For example, the encapsulant 350 resulting after the grinding (if performed) and the first surface 340a of the semiconductor die 340 is attached to the second dummy substrate 360, a plurality of semiconductor dies 340 attached to the second dummy substrate 360 are divided into individual semiconductor devices each including at least one semiconductor die, followed by connecting the contact structures 370 to the exposed surface of the second interposer 314 in each of the individual semiconductor devices.

As described above, according to this example, the placement and encapsulating of the semiconductor die 340 is arranged as a final (or a later) process in the manufacturing method of the semiconductor device, for example after the formation of interposer 210, thereby providing a semiconductor device having suppressed wafer warpage deformation due to a difference in the thermal expansion coefficient between the semiconductor die 340 and the first redistribution layer 312.

FIGS. 6A to 6K show cross-sectional views illustrating various aspects of an example method for manufacturing a semiconductor device, in accordance with various aspects of the present disclosure. The example method aspects of FIG. 6 may, for example, share any or several aspects or elements with the example method aspects of FIGS. 1-5 discussed previously and/or with any method discussed herein.

Figure 6A:
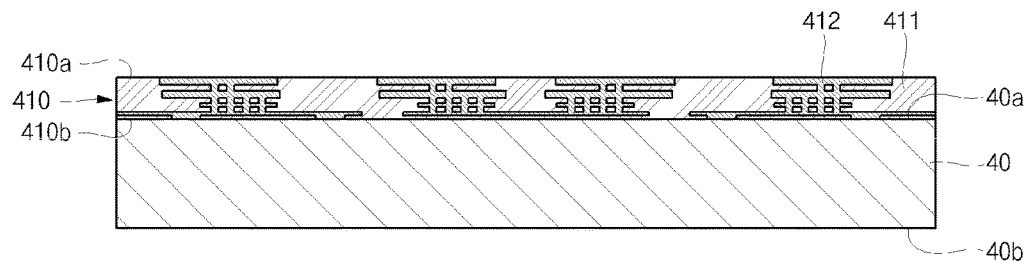
FIGS. 6A to 6K show cross-sectional views illustrating various aspects of an example method for manufacturing a semiconductor device, in accordance with various aspects of the present disclosure.

As illustrated in FIG. 6A, a dummy substrate 40 is prepared, the dummy substrate 40 having a generally flat first surface 40a and a generally flat second surface 40b opposite to the first surface 40a, and a first interposer 410 may be formed on the first surface 40a of the dummy substrate 40. The first interposer 410 includes a first dielectric layer 411 and a first redistribution layer 412. The first interposer 410, for example having a multi-layered structure, may be completed by repeatedly performing the forming of the first dielectric layer 411 and the forming of the first redistribution layer 412 multiple times (e.g., repeatedly forming respective portions thereof). The first interposer 410 may have the first surface 410a and the second surface 410b opposite to the first surface 410a, and the first redistribution layer 412 may be exposed to the first surface 410a and the second surface 410b (e.g., through openings in the first dielectric layer 411).

Figure 6B:
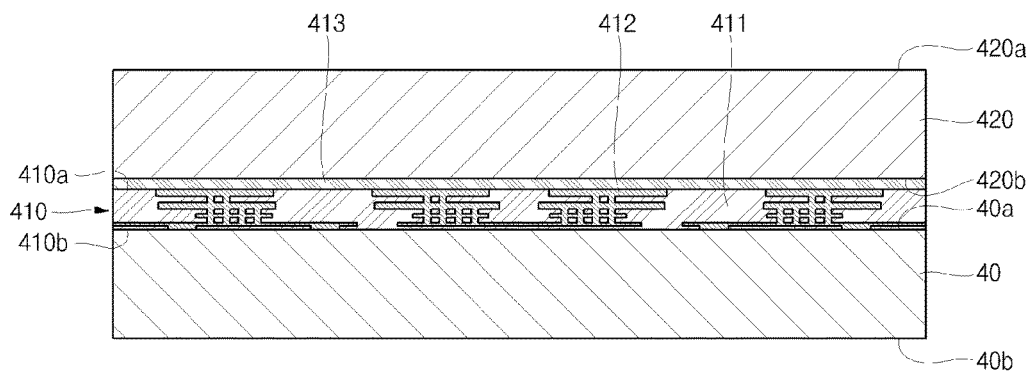

As illustrated in FIG. 6B, a first WSS 420 may be attached to the first surface 410a of the first interposer 410. For example, the first WSS 420 may be attached to the first surface 410a of the first interposer 410 using a first adhesive 413. The first WSS 420 may support and fix the first interposer 410 in a state in which the dummy substrate 40 is removed. The first WSS 420 may have a first surface 420a and a second surface 420b opposite to the first surface 420a and adhered to the first adhesive 413.

Figure 6C:
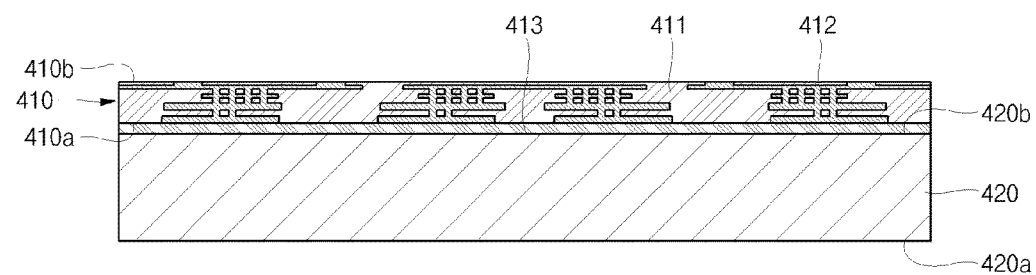

As illustrated in FIG. 6C, the dummy substrate 40 may be removed from the second surface 410b of the first interposer 410. Prior to this process, in a state in which the first surface 410a of the first interposer 410 is attached to the first WSS 420, the second surface 410b of the first interposer 410 may be flipped to face upward. The dummy substrate 40 may then be removed by grinding the same by a predetermined thickness, followed by performing dry etching and/or wet etching, thereby completely removing the dummy substrate 40. As a result, the second surface 410b of the first interposer 410 may be exposed to the outside.

Figure 6D:
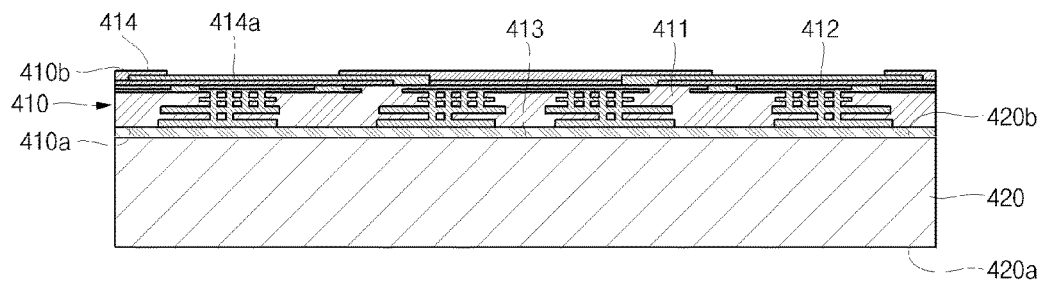

As illustrated in FIG. 6D, a second interposer 414 may be formed on the second surface 410b of the first interposer 410. The second interposer 414 includes a second dielectric layer 414b and a conductive second redistribution layer 414a. The second redistribution layer 414a may, for example, be formed as a redistribution layer having a relatively large width relative to general connecting traces (e.g., defined as a pad or a land as well).

Figure 6E:
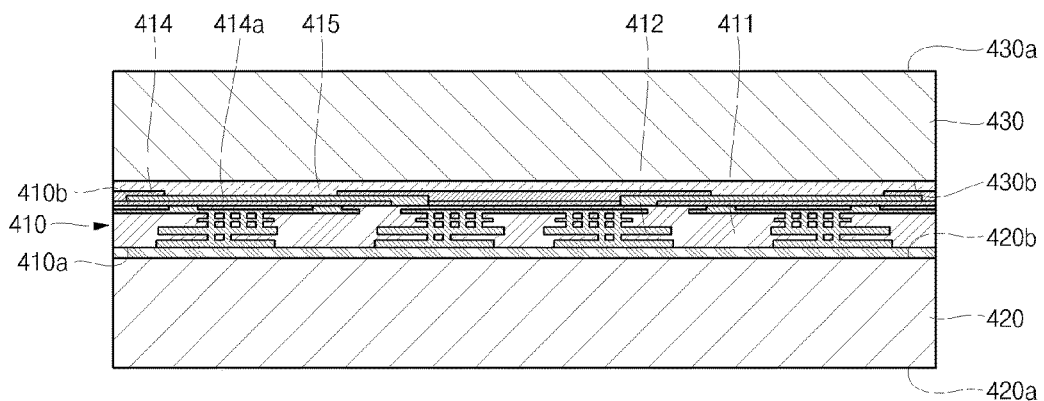

As illustrated in FIG. 6E, a second WSS 430 may be attached to an exposed surface (e.g., a top surface) of the second interposer 414. For example, the second WSS 430 may be attached to the one exposed surface of the second interposer 414 using a second adhesive 415. The second WSS 430 may, for example, support and fix the first interposer 410 and the second interposer 414 in a state in which the first WSS 420 is removed.

Figure 6F:
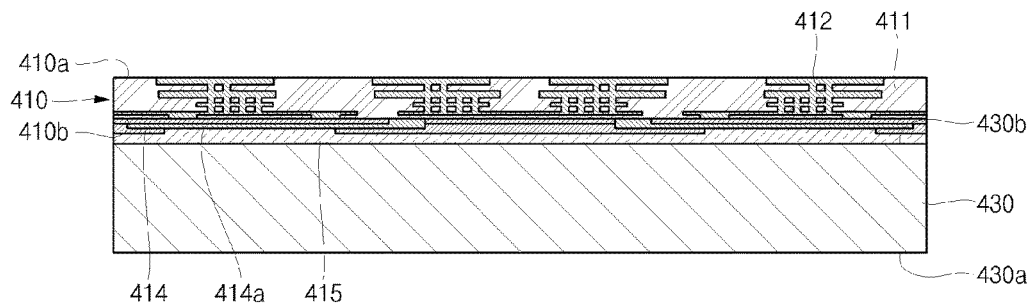

As illustrated in FIG. 6F, the first WSS 420 may be removed from the first surface 410a of the first interposer 410. Prior to this process, in a state in which the second WSS 430 is attached to the one surface (e.g., the top surface) of the second interposer 414, the first surface 410a of the first interposer 410 may be flipped to face upward. Then, the first WSS 420 may be removed by grinding the same by a predetermined thickness, followed by performing dry etching and/or wet etching, thereby completely removing the first WSS 420. As a result, the first surface 410a of the first interposer 410 is exposed to the outside (e.g., as it was also shown back at FIG. 6A). Note that other techniques for WSS removal may also be utilized in the WSS-removal steps discussed herein. For example, the first adhesive 413 may be photochemically unzipped (e.g., prior to bonding the second WSS 430.

Figure 6G:
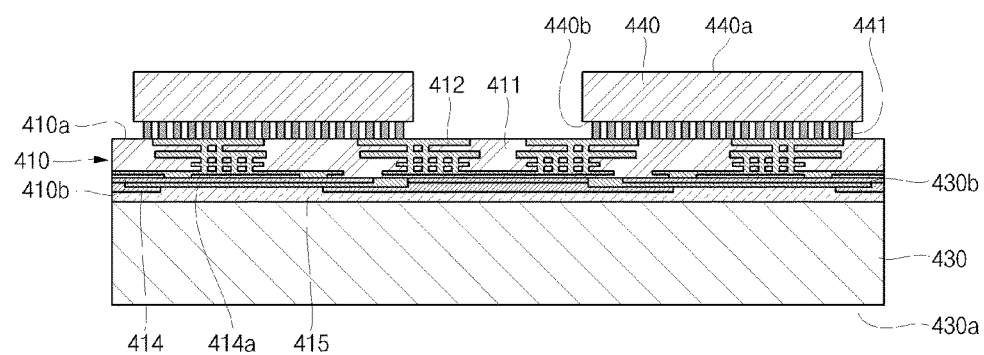

As illustrated in FIG. 6G, the semiconductor die(s) 440 may be electrically connected to the first surface 410a of the first interposer 410. Each of the semiconductor dies 440 has a first surface 440a and a second surface 440b opposite to the first surface 440a, and a die contact 441 may be provided on the second surface 440b. The semiconductor dies 440 may, for example, be electrically connected to the first redistribution layer 412 formed on the first surface 410a of the first interposer 410 through the die contact 441. For example, the semiconductor die(s) 440 may be connected to the first interposer 410 in a flip chip configuration. The die contact 441 may, for example, further include a solder cap (not shown) formed at its end to facilitate a connection with the first interposer 410. The die contact 441 may, for example, generally include a conductive structure formed on and/or attached to bond pads on the die(s) 440 (e.g., a bump on a bumped die, etc.).

Figure 6H:
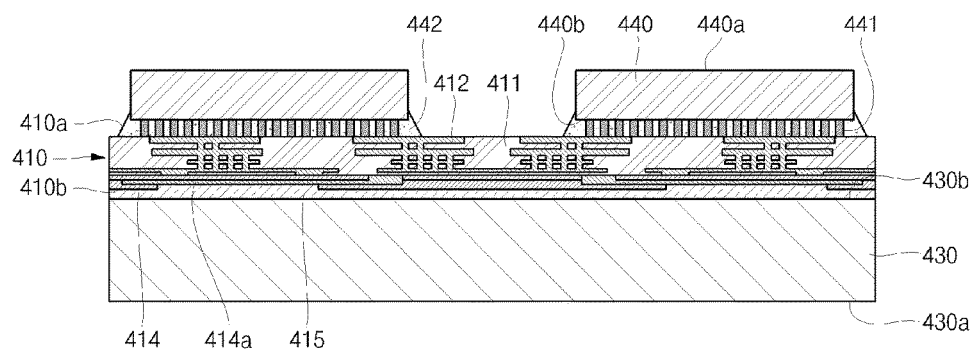

As illustrated in FIG. 6H, an underfill 442 may be injected into a space between the semiconductor dies 440 and the first interposer 410, followed by hardening. For example, the underfill 442 may be interposed between the second surface 440b of the semiconductor die(s) 340 and the first surface 410a of the first interposer 410 and may be formed to cover the die contact 441 and the exposed redistribution layer 412. The semiconductor dies 440 may, for example, be more stably fixed on the first interposer 410 by the underfill 442 such that the semiconductor dies 440 and the first interposer 410 are not electrically disconnected from each other in spite of a difference in respective thermal expansion coefficients. In some cases, if a filler diameter of the encapsulant 450 to be described later is smaller than a gap between the semiconductor die(s) 440 and the first interposer 410, the encapsulant 450 can be formed in the gap between the semiconductor die(s) 440 and the first interposer 410. In such a scenario, a separate underfill 442 might not be utilized, or encapsulant 450 can comprise underfill 442. Note that in any of the underfilling steps discussed herein, the underfilling need not be performed by dispensing or injecting the underfill after die attachment. For example, the underfill may be pre-applied in a film or liquid form prior to die attachment.

Figure 6I:
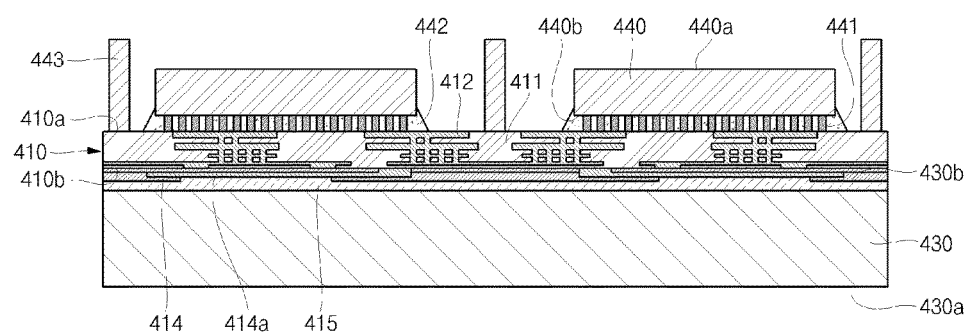

As illustrated in FIG. 6I, a copper pillar 443 is formed between the semiconductor dies 440 on the first surface 410a of the first interposer 410. The copper pillar 443 is made of a conductive material and is electrically connected to the first redistribution layer 412 exposed to the first surface 410a of the first interposer 410. The copper pillar 443 may, for example, be preformed and placed, built up on the first redistribution layer 412, etc. The copper pillar 443 may, for example, be cylindrical and/or columnar. The copper pillar 443 may, for example, comprise a circular, elliptical, rectangular or square cross-section (e.g., a horizontal or axial cross-section). Also for example, the copper pillar 443 may be configured as a wall or cage (e.g., enclosing some or all sides of the semiconductor dies 440). For example, the copper pillar 443 may be plated or formed from preformed wire (e.g., copper, gold, aluminum, or other conductive material) bonded to the first interposer 410.

Figure 6J:
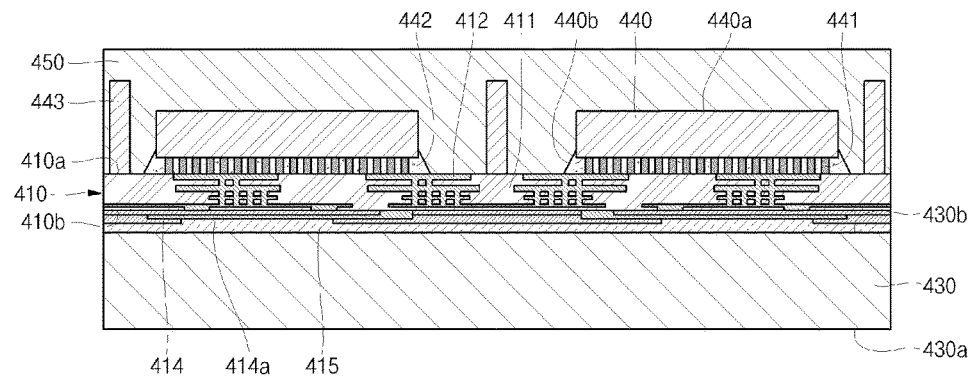

As illustrated in FIG. 6J, the first surface 410a of the first interposer 410, the semiconductor dies 440 and the copper pillar 443 may be encapsulated by an encapsulant 450. For example, the encapsulant 450 may be formed to entirely cover the first surface 410a of the first interposer 410, the semiconductor dies 440 and the copper pillar 443. Such covering may then, for example, be followed by back grinding and/or etching or otherwise thinning (if needed) to allow the first surface 440b of the semiconductor die 440 and/or at least one surface of the copper pillar 443 to be exposed to the outside. The semiconductor dies 440 and the first interposer 410 may be protected from external circumstances by the encapsulant 450. The encapsulant 450 may, for example, include general epoxy, paste, molding compound, and/or equivalents thereof, but not limited thereto.

Figure 6K:
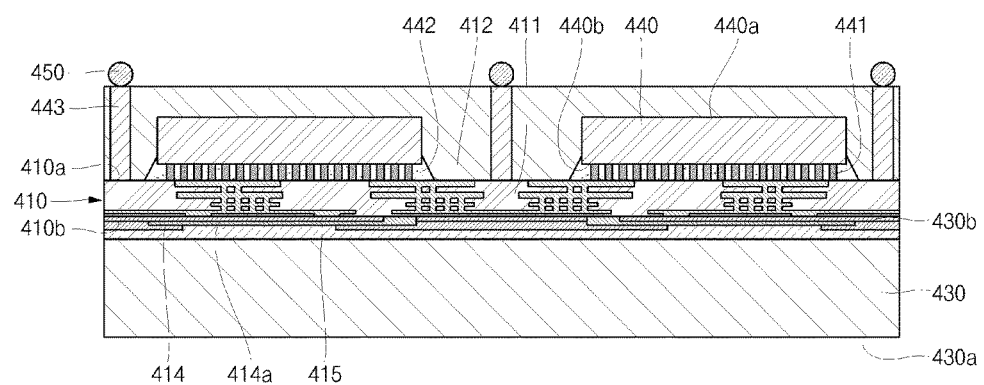

As illustrated in FIG. 6K, contact structures 470 (such as conductive bumps, pillars, balls, or other contact structures comprising solder, copper, or other conductive material) may be connected to a surface of the copper pillar 443. For example, the contact structures 470 may be electrically connected to a surface (e.g., an end surface) of the copper pillar 443 exposed through the encapsulant 450.

Though not shown, the second WSS 430 may be removed at this point and/or may be retained for further processing steps if desired.

As described above, according to this example, the placement and encapsulating of the semiconductor dies 440 and the copper pillar 443 formed between the semiconductor dies 440 is arranged as a final (or later) process in the manufacturing method of the semiconductor device, for example after the formation of interposer 410, thereby providing a semiconductor device having suppressed wafer warpage deformation due to a difference in the thermal expansion coefficient between the semiconductor die 440 and the first redistribution layer 412 and between the copper pillar 443 and the first redistribution layer 412.

FIGS. 7A to 7I show cross-sectional views illustrating various aspects of an example method for manufacturing a semiconductor device, in accordance with various aspects of the present disclosure. The example method aspects of FIG. 7 may, for example, share any or several aspects or elements with the example method aspects of FIGS. 1-6 discussed previously and/or with any method discussed herein.

Figure 7A:
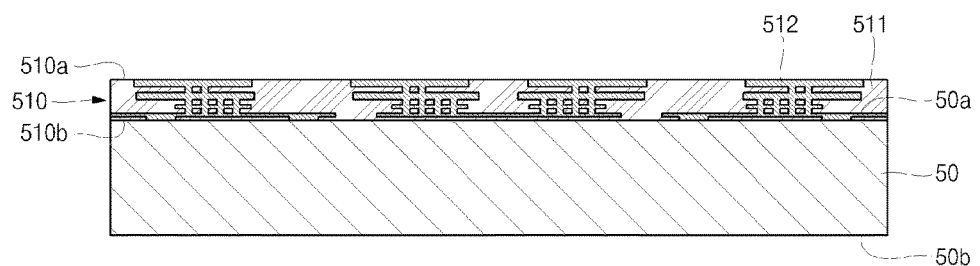
FIGS. 7A to 7I show cross-sectional views illustrating various aspects of an example method for manufacturing a semiconductor device, in accordance with various aspects of the present disclosure.

As illustrated in FIG. 7A, a dummy substrate 50 is prepared, the dummy substrate 50 having a generally flat first surface 50a and a generally flat second surface 50b opposite to the first surface 50a, and a first interposer 510 may be formed on the first surface 50a of the dummy substrate 50. The first interposer 510 includes a first dielectric layer 511 and a first redistribution layer 512. The first interposer 510, for example having a multi-layered structure, may be completed by repeatedly performing the forming of the first dielectric layer 511 and the forming of the first redistribution layer 512 multiple times (e.g., repeatedly forming respective portions thereof). The first interposer 510 may have a first surface 510*a* and a second surface 510*b* opposite to the first surface 510*a*, and the first redistribution layer 512 may be exposed to the first surface 510*a* and the second surface 510*b* (e.g., through openings in the first dielectric layer 511).

Figure 7B:
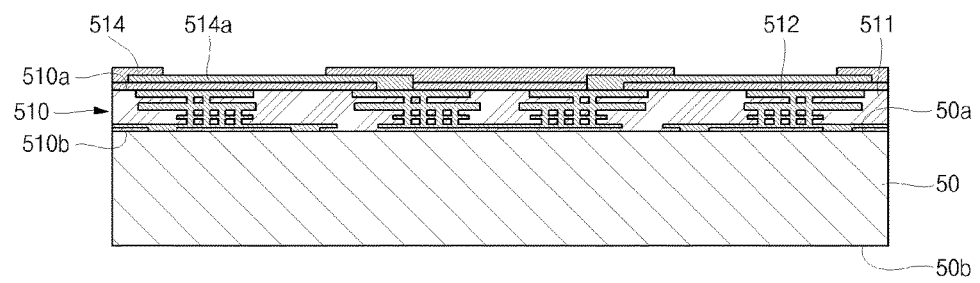

As illustrated in FIG. 7B, a second interposer 514 may be formed on the second surface 510*b* of the first interposer 510. The second interposer 514, for example, includes a second dielectric layer 514*b* and a conductive second redistribution layer 514*a*. For example, the second dielectric layer 514*b* may be made of polyimide and the second redistribution layer 514*a* may be made of copper, but aspects of the present disclosure are not limited thereto. At least a portion of the respective materials (e.g., dielectric materials) utilized in forming the first interposer 510 and the second interposer 514 may be different. Also for example, as discussed herein, there may be differences in structural feature characteristics (e.g., layer thicknesses, conductor widths, etc.) between the first interposer 510 and the second interposer 514.

Figure 7C:
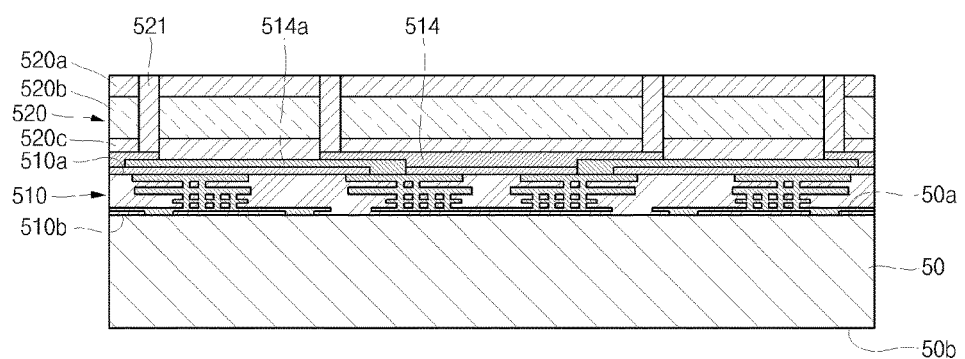

As illustrated in FIG. 7C, one or more insulation fillers 521 may be formed on the first surface of the second interposer 514 to be spaced apart from each other. The insulation fillers 521 may, for example, be made of an insulating material. In addition, one or more conductive pad layers 520 connected to the second redistribution layer 514*a* are formed between a first surface of the second interposer 514 and the insulation fillers 521. The conductive pad layers 520 may, for example, have a structure in which one or more conductive material layers are stacked one on another. For example, each of the conductive pad layers 520 may comprise a first conductive layer 520*c* formed on (e.g., directly on) a surface of the second interposer 514, a second conductive layer 520*b* formed on (e.g., directly on) the first conductive layer 520*c*, and a third conductive layer 520*a* formed on (e.g., directly on) the second conductive layer 520*b*. Here, the first conductive layer 520*c* and the third conductive layer 520*a* may be formed to have the same thickness. In addition, the second conductive layer 520*b* may have a larger thickness than the first conductive layer 520*c* and the third conductive layer 520*a*. In the present example, since the first conductive layer 520*c* and the third conductive layer 520*a* have the same thickness, a balance between the first interposer 510 and the second interposer 514 may be kept, and wafer warpage deformation due to thermal expansion may be suppressed. In addition, the first conductive layer 520*c* and the third conductive layer 520*a* may be formed using the same material (e.g., the same material as the second conductive layer 520*b*). Alternatively, the first conductive layer 520*c* and the third conductive layer 520*a* may be formed using a material that is different from the second conductive layer 520*b*. In the present example, thermal expansion coefficients of the conductive pad layers 520 may be adjusted by controlling proportions of materials forming the first conductive layer 520*c*, the third conductive layer 520*a* and the second conductive layer 520*b* and/or by adjusting the respective types of material. For example, the first conductive layer 520*c* and the third conductive layer 520*a* may be made completely or mostly of copper and the second conductive layer 520*b* may be made completely or mostly of nickel.

In the present example, one or more insulation fillers 521 may be formed on one surface of the second interposer 514 to be spaced apart from each other, and one or more conductive pad layers 520 connected to the second redistribution layer 514*a* may be formed between the one surface of the second interposer 514 and the insulation fillers 521, but aspects of the present disclosure are not limited thereto. Alternatively, the conductive pad layers 520 may be formed on the one surface of the second interposer 514 and the insulation fillers 521 may then be formed. In this case, the insulation fillers 521 may serve to support the conductive pad layers 520 to be balanced with respect to each other, thereby suppressing wafer warpage deformation from occurring to the conductive pad layers 520. Note that although the particular example shown in FIG. 7 uses a combination of conductive layers and insulation fillers 521 to form a stiffener structure, other materials may also be utilized. For example, one or more or all of the conductive layers 520 may be replaced with insulating (or dielectric) layers. Conductive pathways and/or vias may then be formed on or through insulative layers as needed. Conversely, one or more insulation fillers 521 may be replaced with conductive material, depending on the implementation.

Figure 7D:
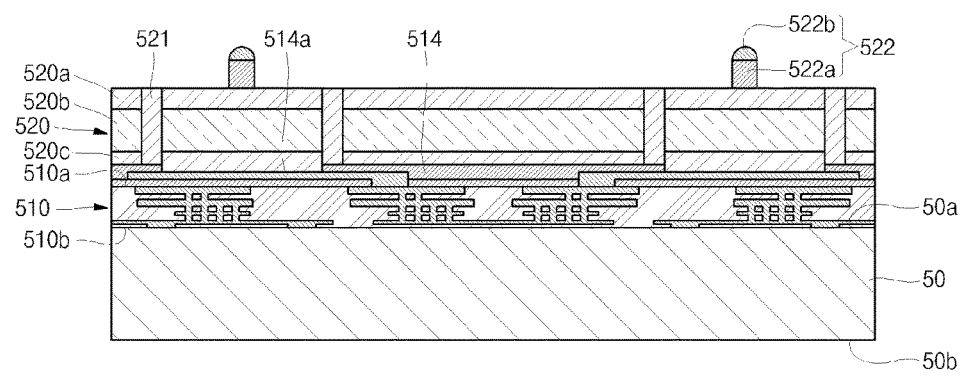

As illustrated in FIG. 7D, contact structures 522 (such as conductive bumps, pillars, balls, or other contact structures comprising solder, copper, and/or other conductive material) are formed on conductive pad layers alternately formed among the conductive pad layers 520 formed between the insulation fillers 521. The contact structures 522 may, for example, include copper pillars 522*a* (e.g., columns, pillars, pedestals, extended pads, etc.) connected to the conductive pad layers 520 and solder balls 522*b* (or caps) formed in or on the copper pillars 522*a*. For example, the copper pillars 522*a* may be plated or formed from preformed of wire (e.g., copper, gold, aluminum, or other conductive material) bonded to the conductive pad layer(s).

Figure 7E:
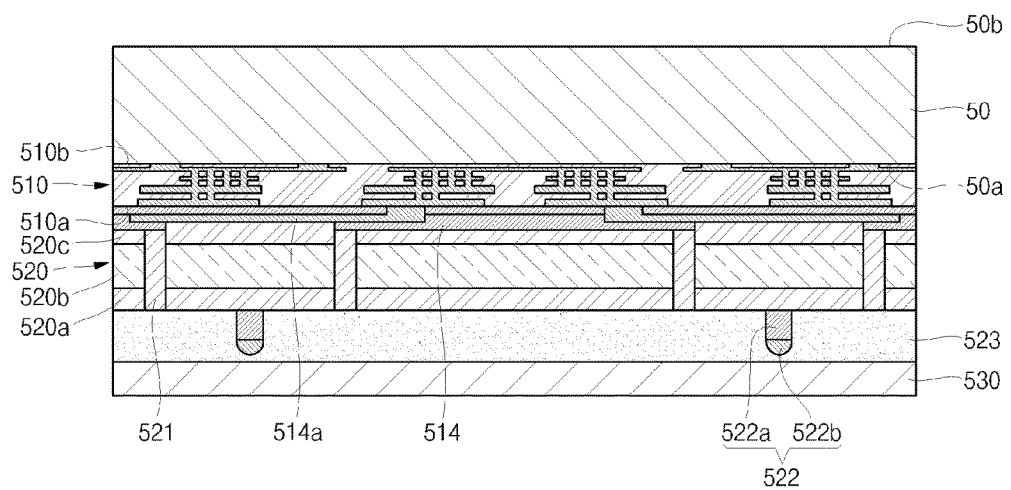

As illustrated in FIG. 7E, a wafer support system (WSS) 530 may, for example, be attached to one surface each of the conductive pad layers 520 and each of the contact structures 522. For example, the WSS 530 may be attached to the one surface of the conductive pad layer 520 and the contact structures 522 using an adhesive 523. For example, the adhesive 523 may be at least as thick as, or thicker than, the contact structures 522. The WSS 530 may support and fix the conductive pad layers 520 in a state in which the dummy substrate is removed.

Figure 7F:
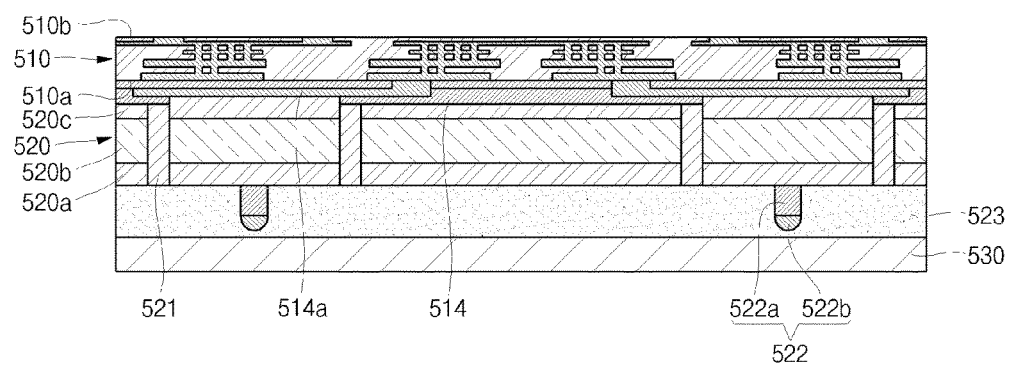

As illustrated in FIG. 7F, the dummy substrate 50 may be removed from the second surface 510*b* of the first interposer 510. For example, the dummy substrate 50 may be removed by grinding the same by a predetermined thickness, followed by performing dry etching and/or wet etching, thereby completely removing the dummy substrate 50. As a result, the second surface 510*b* of the first interposer 510 may be exposed to the outside.

Figure 7G:
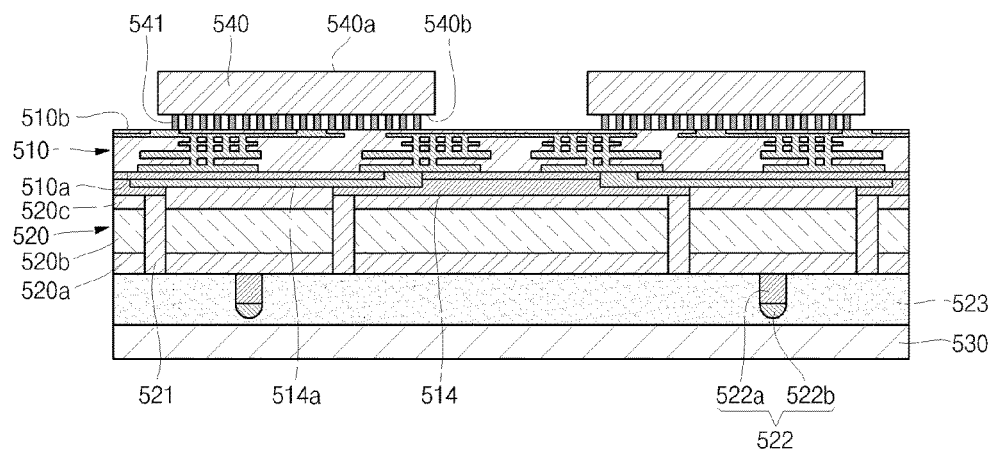

As illustrated in FIG. 7G, a semiconductor die 540 may be electrically connected to the second surface 510*b* of the first interposer 510. The semiconductor die 540 may have a first surface 540*a* and a second surface 540*b* opposite to the first surface 540*a*, and die contacts 541 may be provided on the second surface 540*b*. The semiconductor die 540 may, for example, be electrically connected to a first redistribution layer 512 at the second surface 510*b* of the first interposer 510 through the die contacts 541.

Figure 7H:
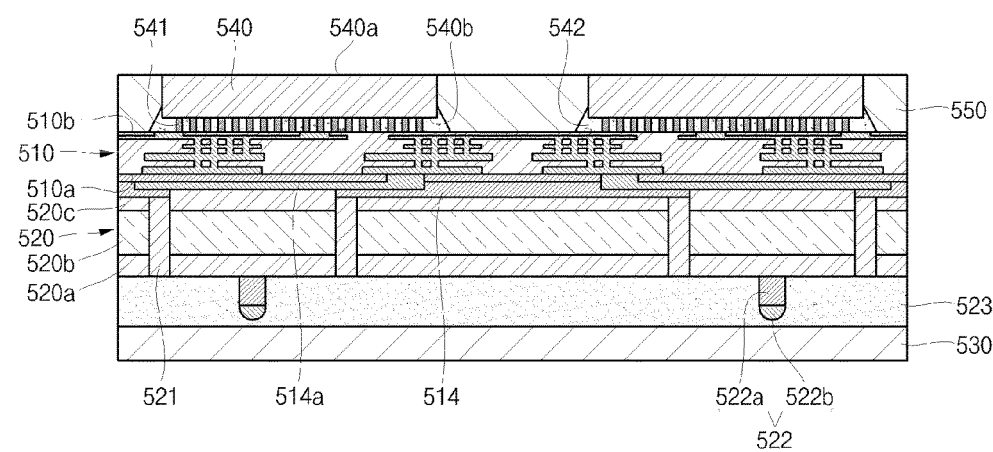

As illustrated in FIG. 7H, the second surface 510b of the first interposer 510 and the semiconductor die 540 may be encapsulated using an encapsulant 550. Prior to this process, an underfill 542 covering the die contacts 541 between the semiconductor die 540 and the first redistribution layer 512 may be formed after the die contacts 541 of the semiconductor die 540 are electrically connected to the second surface 510b of the first interposer 510. Then, the encapsulant 550 may be formed to entirely cover the first surface 510a of the first interposer 510. Such covering may then, for example if exposure of the semiconductor die 540 is desired, be followed by back grinding and/or etching or otherwise thinning (if needed) to allow the first surface 540a of the semiconductor die 540 to be exposed from the encapsulant 550. The semiconductor die 540 and the first interposer 510 may be protected from external circumstances by the encapsulant 550. The encapsulant 350 may, for example, include general epoxy, paste, molding compound, and/or equivalents thereof, but not limited thereto.

Figure 7I:
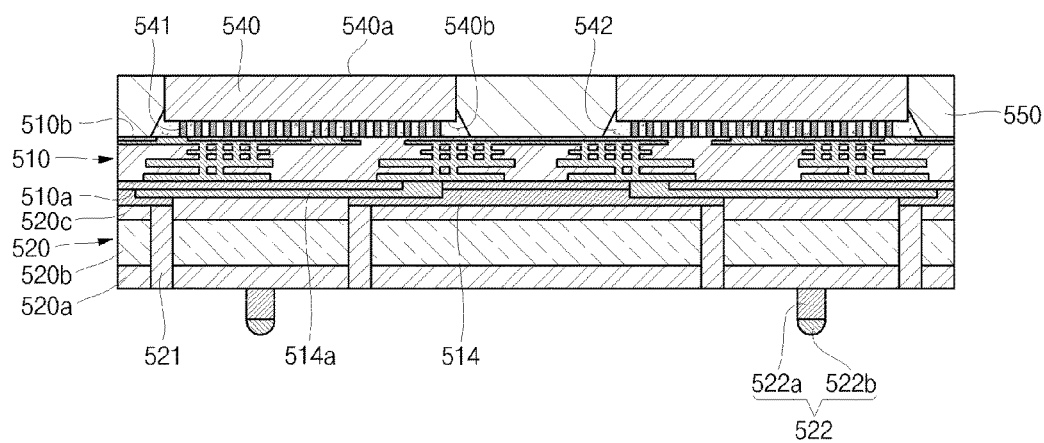

As illustrated in FIG. 7I, the WSS 530 attached to surfaces of each of the conductive pad layers 520 and the contact structures 522 may be removed.

As described herein, according to this example, the placement and encapsulating of the semiconductor dies may be arranged as a final (or a later) process in the manufacturing method of the semiconductor device, for example after the formation of an interposer, thereby providing a semiconductor device having suppressed wafer warpage deformation due to a difference in the thermal expansion coefficient between the semiconductor die and the first redistribution layer.

As shown in the example provided at FIG. 7, the stiffener structure may be provided at or toward the interposer side of the package. The scope of various aspects of this disclosure is not, however, limited to such placement. For example, the stiffener structure may alternatively, or additionally, be provided at the mold side of the package. Non-limiting examples of such structures and methods for forming such structures will now be presented with references to FIGS. 8-11.

Figure 8:
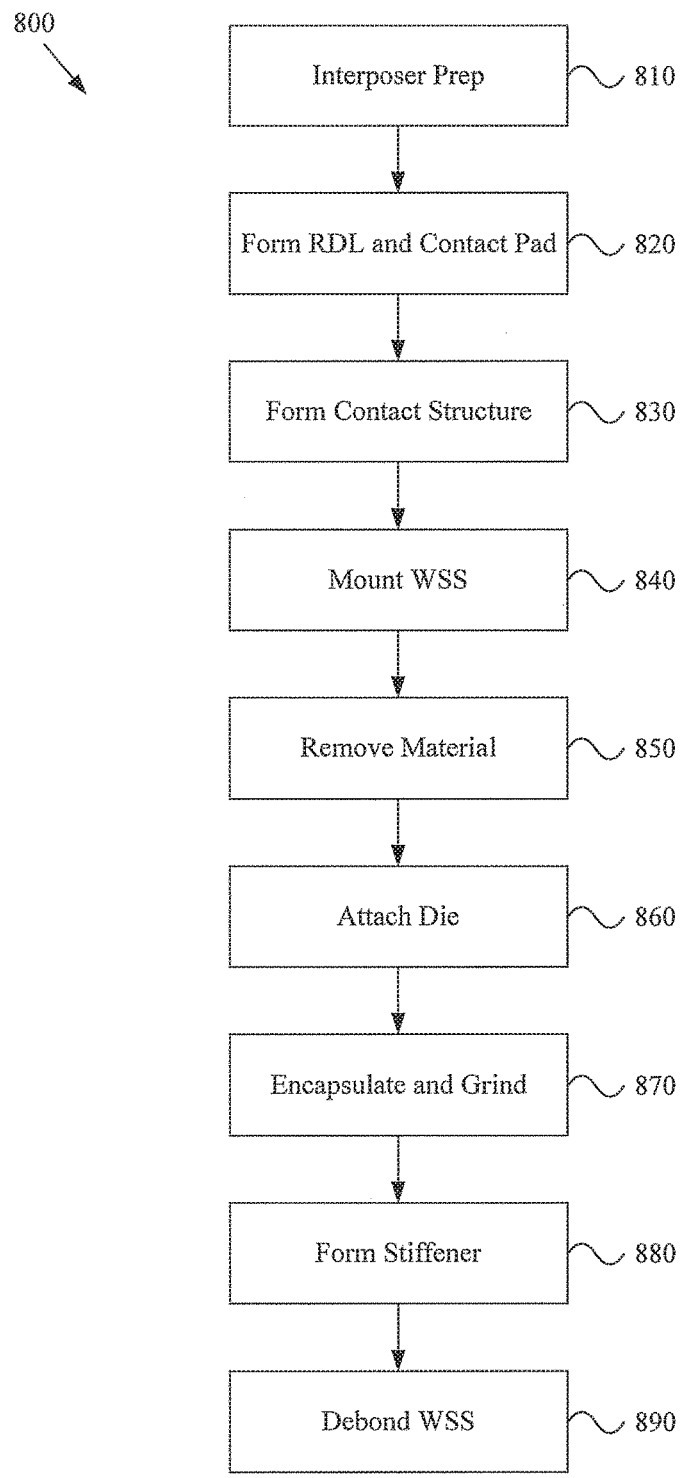
FIG. 8 is a flowchart illustrating an example method for manufacturing a semiconductor device, in accordance with various aspects of the present disclosure.

FIG. 8 is a flowchart illustrating an example method 800 for manufacturing a semiconductor device, in accordance with various aspects of the present disclosure.

Referring to FIG. 8, the example method 800 of manufacturing a semiconductor device may, for example, comprise interposer preparing 810, forming an RDL and contact pad 820, forming a contact structure 830, WSS mounting 840, removing material 850, die attaching 860, encapsulating and grinding 870, stiffener forming 880, and WSS debonding 890. The example method 800 may, for example, share any or all characteristics with the other methods discussed herein. The example manufacturing method of FIG. 8 will now be described in more detail with reference to FIGS. 9A to 9I.

FIGS. 9A to 9I show cross-sectional views illustrating various aspects of the example method 800 shown in FIG. 8. It should be noted that FIGS. 9A to 9I merely provide examples of various aspects of the method 800 shown in FIG. 8. Accordingly, the scope of various aspects of the method 800 should not be limited by the example illustrations of FIGS. 9A to 9I.

Figure 9A:
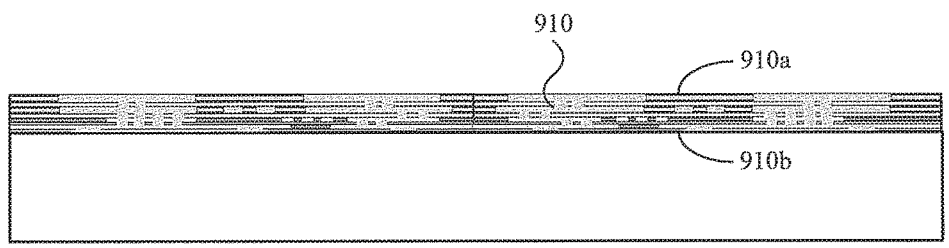
FIGS. 9A to 9I show cross-sectional views illustrating various aspects of the example method shown in FIG. 8.

First, as illustrated in FIG. 9A, an interposer 910 is prepared. The interposer 910 may, for example, be formed on a wafer substrate (e.g., a silicon wafer substrate), a substrate from a singulated wafer, etc. The interposer may, for example be formed by a fabrication (FAB) process, such as a semiconductor back-end-of-the-line (BEOL) process, but the present disclosure is not limited to the utilization of a fabrication process. Various examples of interposer formation are presented herein. The interposer 910 may have a first surface 910a and a second surface 910b opposite to the first surface 910a.

As shown in FIG. 9A, the interposer 910 is formed on a full-thickness wafer. In such an example scenario, the wafer need not be full thickness at this point. For example, the wafer may have been at least partially thinned at a previous process step.

Figure 9B:
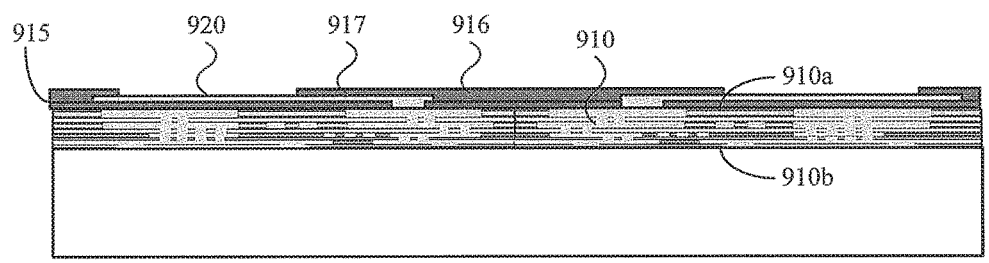

As illustrated in FIG. 9B, a redistribution layer (RDL) 915, which may also be referred to herein as a second interposer, and contact pad 920 are formed (e.g., on the first surface 910a of the interposer 910). For example, the interposer 910 as illustrated at FIG. 9A may be received from an upstream process, and the RDL 915 and contact pad 910 may be formed thereon. The RDL 915 and contact pad 920 may be formed in any of a variety of manners generally associated with such structures. For example, the RDL 915 may be formed by forming a dielectric layer 916 and forming a conductive layer 917 on and/or extending through the dielectric layer. Such dielectric layer 916 and conductive layer 917 forming may then be repeated multiple times if a multi-layer RDL is desired. The RDL 915 may, for example, be formed in a process step that is independent from the forming of the interposer 910. In an example scenario, the interposer 910 may be formed in a FAB (e.g., a BEOL) process, and the RDL 915 may be formed in a post-FAB process (e.g., at a same general geographical site, or at distinct geographical sites coupled by a shipping process). The RDL 915 may, for example, be formed using different dielectric material, different conductive material, wider material, thicker material, etc., than the interposer 910. For example, dielectric material of the interposer 910 may comprise an inorganic dielectric, such as silicon oxide, silicon nitride, etc. The dielectric material may also, for example, comprise an organic material. The dielectric material of the RDL 915 may comprise an organic dielectric, such as PBO, polyimide, etc. The dielectric material may also, for example, comprise an inorganic material. The contact pad 920 (e.g., a bump pad) may, for example, be formed as a conductive portion of the RDL 915 that is exposed through dielectric material. The contact pad 920 may, for example, be coated (e.g., plated) with an under-contact metal (e.g., an under-bump metal (UBM)) to enhance attachment of a contact structure to the contact pad 920 in a later process step.

Figure 9C:
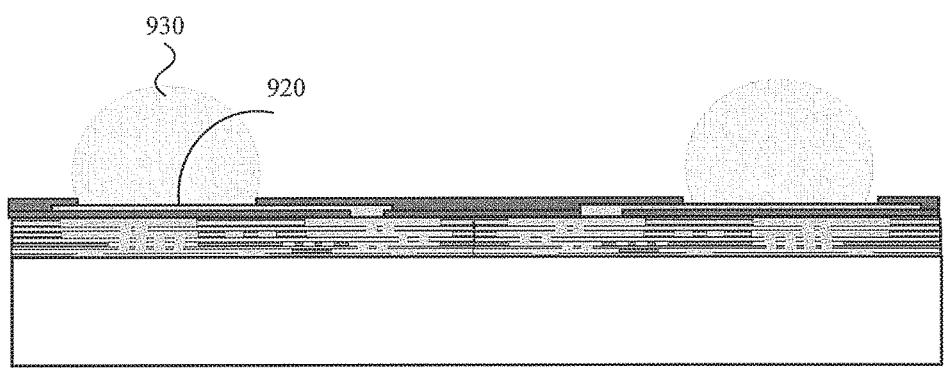

As illustrated in FIG. 9C, a contact structure 930 (such as conductive bumps or balls, plated or preformed wire pillars, or other contact structures comprising solder, copper, and/or other conductive material) may further be formed on the contact pad 920. The contact structure 930 may, for example, be formed to be easily connected to a wafer support system (WSS) 940 described herein. The contact structure 930 is electrically connected to the contact pad 920. For example, in an implementation utilizing a conductive ball, volatile flux may be applied to the contact pad 920, and the contact structure 930 comprising a conductive ball can be positioned on the flux, followed by applying heat of a temperature ranging from approximately 150° C. to approximately 250° C. or 270° C. thereby connecting the contact structure 930 to the contact pad 920 while allowing the flux to volatilize. Thereafter, a cooling process may be performed to solidify the mechanical/electrical connection between the contact structure 930 and the contact pad 920.

Figure 9D:
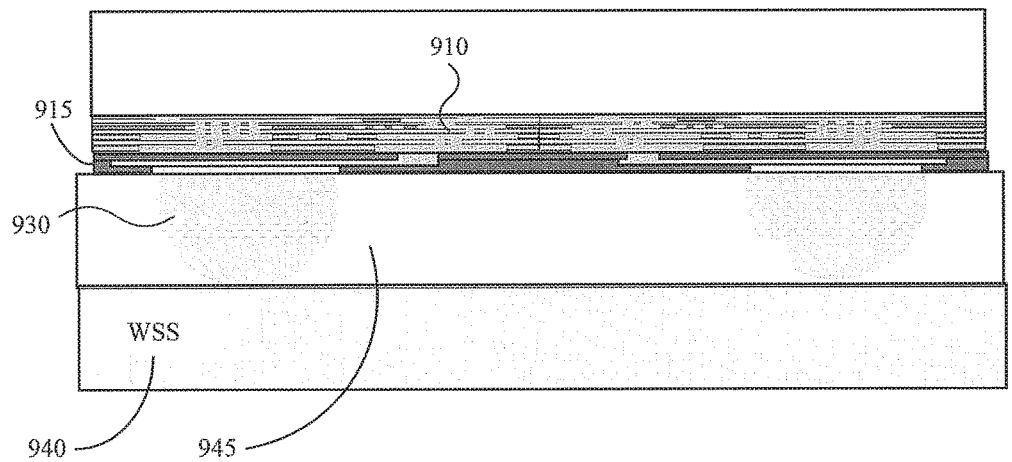

As illustrated in FIG. 9D, a wafer support system (WSS) 940 is mounted to the contact structure 930 and RDL 915.

The WSS 940 may, for example, be mounted to the contact structure 930 and RDL 915 using an adhesive 945 (or epoxy). The WSS 940 may comprise any of a variety of materials. For example, as with all wafer support systems discussed herein, the WSS 940 may comprise glass, metal, ceramic, general dielectric material, etc. The adhesive 945 may, for example, generally be thick enough to surround the entire contact structure 930. Alternatively, the WSS 940 may comprise a compliant material into which at least a portion of the contact structure 930 or the entire contact structure 930 may extend. The WSS 940 may, for example, support and fix the interposer 910 in a state in which material (e.g., excess silicon or other material) may be removed from the interposer 910.

Figure 9E:
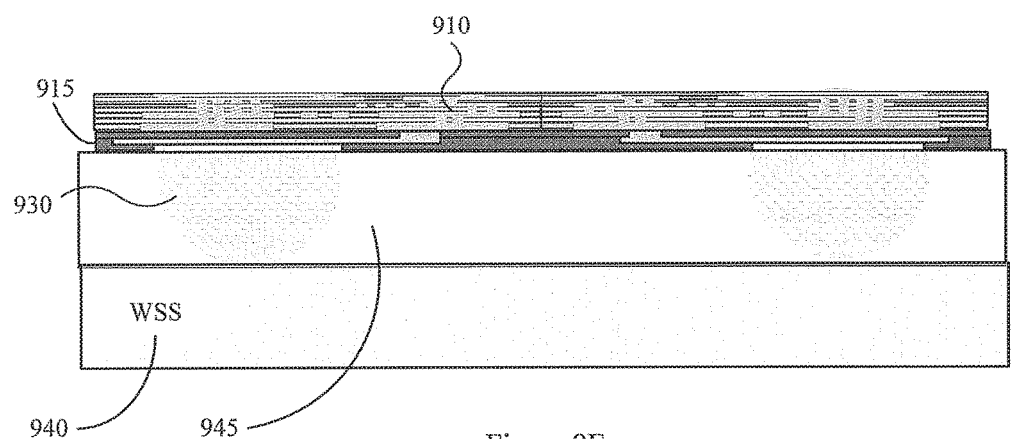

As illustrated in FIG. 9E, material is removed from the interposer 910. For example, in an example implementation in which traces of the interposer 910 are formed on a silicon wafer, for example in a FAB process, the excess wafer material may be removed (e.g., by grinding and/or etching, ablating, etc.). The WSS 940, for example, may provide primary structural support for the interposer 910, RDL 915, and/or contact structure 930 when the interposer 910 is thinned. In an example implementation in which the interposer 910 is fabricated on a silicon wafer, the resulting thickness of the interposer 910 may, for example, be in the range of 8-10 microns or thinner.

Figure 9F:
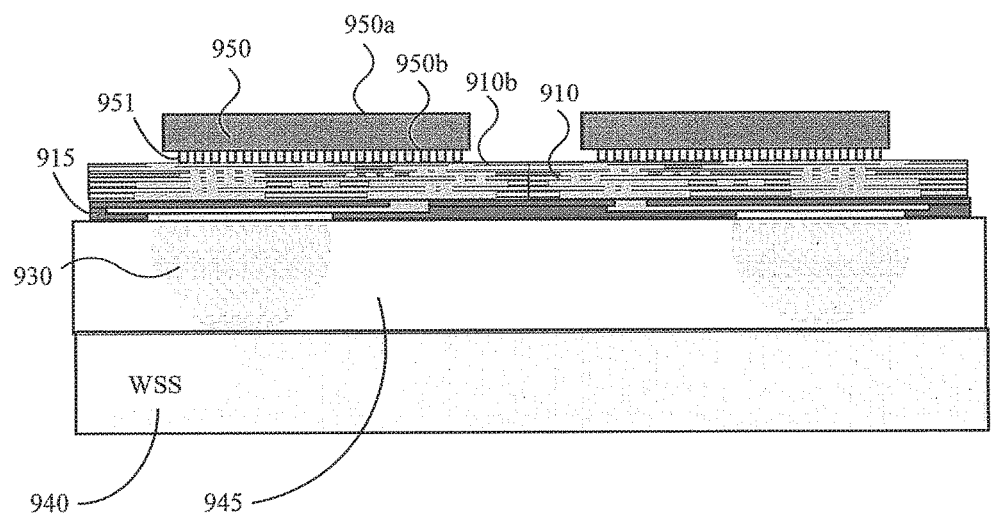

As illustrated in FIG. 9F, one or more semiconductor die 950 are attached. For example, the semiconductor die 950 may be electrically connected to the interposer 910 (e.g., to the second surface 910b of the interposer 910. The semiconductor die 950 has a first surface 950a and a second surface 950b opposite to the first surface 950a, and a die contact 951 is provided on the second surface 950b. The semiconductor die 950 is electrically connected to the interposer 910 through the die contact 951 (and others like it). For example, the semiconductor die 950 may be connected to the interposer 910 in a flip chip configuration. The die contact 951 may, for example, further include a solder cap formed at its end to facilitate a connection with the interposer 910. The die contact 951 may, for example, generally comprise a conductive structure formed on and/or attached to bond pads on the die 950 (e.g., a bump on a bumped die, etc.).

Figure 9G:
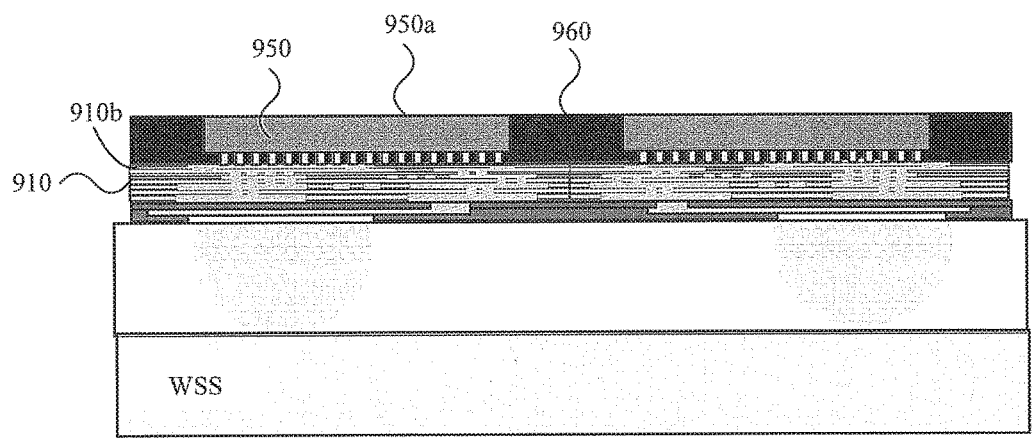

As illustrated in FIG. 9G, encapsulant 960 (e.g., mold material) is applied and ground. The interposer 910 and the semiconductor die 950 may be encapsulated by the encapsulant 960. The encapsulant 960 may, for example, be formed to entirely cover the second surface 910b of the interposer 910 and the semiconductor die 950. Such covering may then, for example if exposure of the semiconductor die 950 is desired, be followed by back grinding and/or etching or otherwise thinning (if needed) to allow the first surface 950a of the semiconductor die 950 to be exposed from the encapsulant 960 and/or thinned. In other examples, the first surface 950a of the die 950 may be left uncovered by the encapsulant 960 during encapsulation. The interposer 910 and the semiconductor die 950 may be environmentally and/or electrically protected from external circumstances by the encapsulant 960. The encapsulant 960 may, for example, include general epoxy, paste, molding compound, and equivalents thereof, but is not limited thereto.

Note that although the mold material 960 is illustrated underfilling the die 950, a separate underfill may be utilized. Such underfilling is discussed herein (e.g., injected, deposited, taped, etc.) with regard to other examples.

Figure 9H:
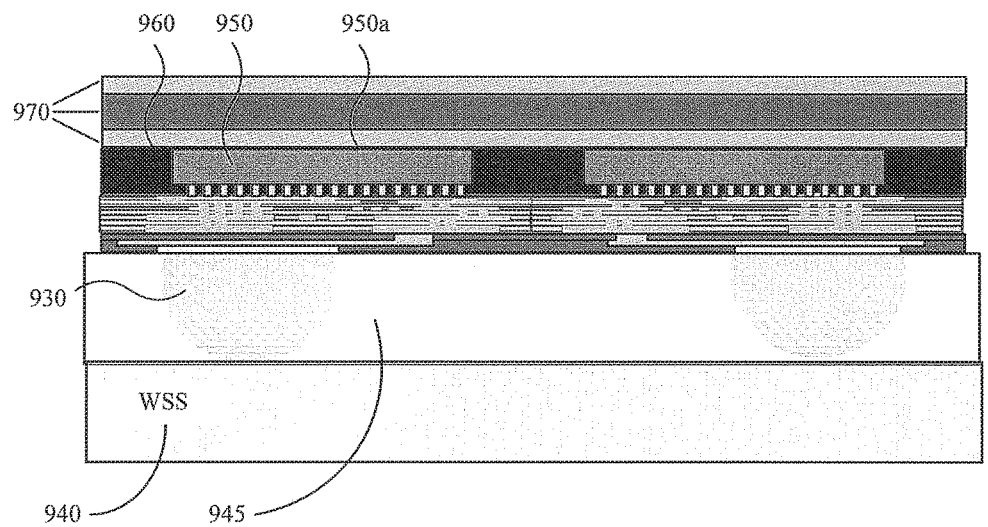

As illustrated in FIG. 9H, a stiffener 970 is formed. A non-limiting example stiffener is presented herein in the discussion of FIG. 7C, but the scope of this disclosure is not limited by the characteristics of such example. The stiffener 970 may, for example, be formed on (e.g., directly on) the surface of the encapsulant 960 and/or the first surface 950a of the semiconductor die 950. The stiffener 970 may be formed in any of a variety of manners. For example, the stiffener 970 may be formed by sputtering, chemical vapor deposition, plating, etc., on the encapsulant 960 and/or first surface 950a. In other words, the stiffener 970 may be integrally coupled to the encapsulant 960 and/or die 950 without using adhesive, and thus for example act more directly to counteract warpage in the underlying structure than would be possible with an intervening adhesive layer.

In the example shown in FIG. 9H, the stiffener 970 comprises three conductive layers, for example two outer layers (e.g., copper layers) and a middle layer (e.g., nickel), though any number of layers may be utilized (e.g., single layer, dual layer, etc.). Though the two outer layers are shown with a same thickness, they may be formed with different respective thicknesses. Though the center layer is shown thicker than the outer layers, the center layer may be the same thickness or thinner than one or both of the outer layers. Also, though the two outer layers may comprise a same material (e.g., copper), they comprise different materials.

In general, the composition and/or geometry of the stiffener 970 layer(s) may be selected to counteract warpage forces acting on the structure comprising the interposer 910, RDL 915, die 950, mold material 960, etc. For example, if the stiffener-less structure comprises forces (e.g., forces due to mismatched thermal expansion coefficients) acting to cause the ends of the structure to bend upward with a force F, the stiffener layer(s) 970 may be selected to provide a force acting to cause the ends of the stiffener 970 to bend downward with an opposite force −F, resulting in an overall structure for the electronic package that stays generally flat under the influence of a variety of temperature conditions. The warpage forces may, for the stiffener-less structure and/or the stiffener, be determined theoretically and/or empirically.

The stiffener 970 layer(s) may also, for example, be continuous or uniform across the surface on which they are formed rather than patterned. Note, however, that in various example implementations some or all of the stiffener 970 layers may be patterned (e.g., to account for varying stress conditions across the electronic package) and/or may have a varying thickness.

The example stiffener 970 discussed herein is generally formed from conductive metal material, but may be formed from any of a variety of materials. For example, the stiffener 970 may comprise composites, oxides, nitrides, etc. In a scenario comprising the utilization of materials such as oxides and/or nitrides, sputtering or other techniques may be utilized to form the stiffener 970 layer(s).

The stiffener 970, when formed at least in part of conductive material, may be utilized to provide electromagnetic shielding for the electronic components of the package. Additionally, for example, the stiffener 970 may be utilized to provide ground and/or power signals to one or more components of the package (or other devices stacked on the package).

As shown in this example, the stiffener 970 layer(s) may be formed prior to removal of the WSS 940.

Figure 9I:
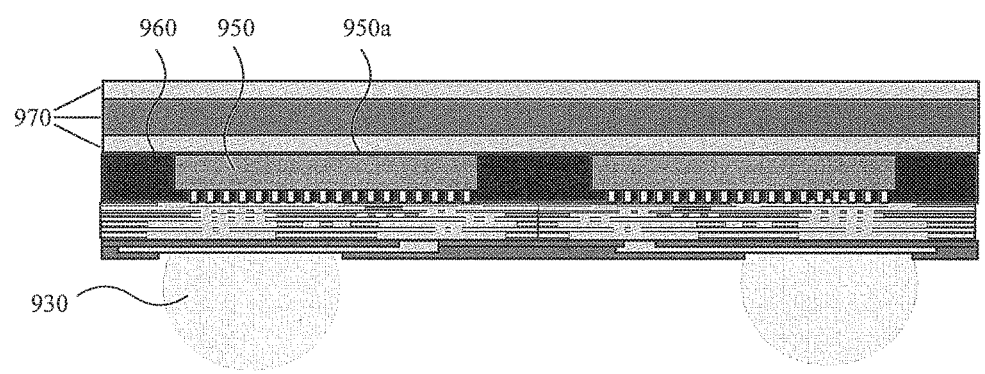

As illustrated in FIG. 9I, the wafer support system (WSS) 940 is removed (e.g., debonded). For example, the WSS 940 and adhesive 945 may be removed, for example by mechanical, chemical, and/or electrical means. The WSS 940 may, for example, be removed in a non-destructive manner, thus preserving the WSS 940 for use in the formation of another electronic package.

The WSS 940 debonding step may, for example, complete formation of the electronic package. Note, however, that further processing steps may also be performed. For example, in an implementation in which the contact structures 930 have not yet been formed, they may now be formed. Also for example, as shown herein, a dicing step may be performed. Additionally for example, the completed semiconductor device may be mounted to be electrically connected (e.g., directly connected) to a printed circuit board (PCB) or other substrate (or wafer, other semiconductor device, die, etc.) through the contact structures 930.

In the example just discussed, the stiffener 970 is formed relatively late in the process. In another example implementation, the stiffener 970 may be formed earlier in the process. An example of this will now be presented.

Figure 10:
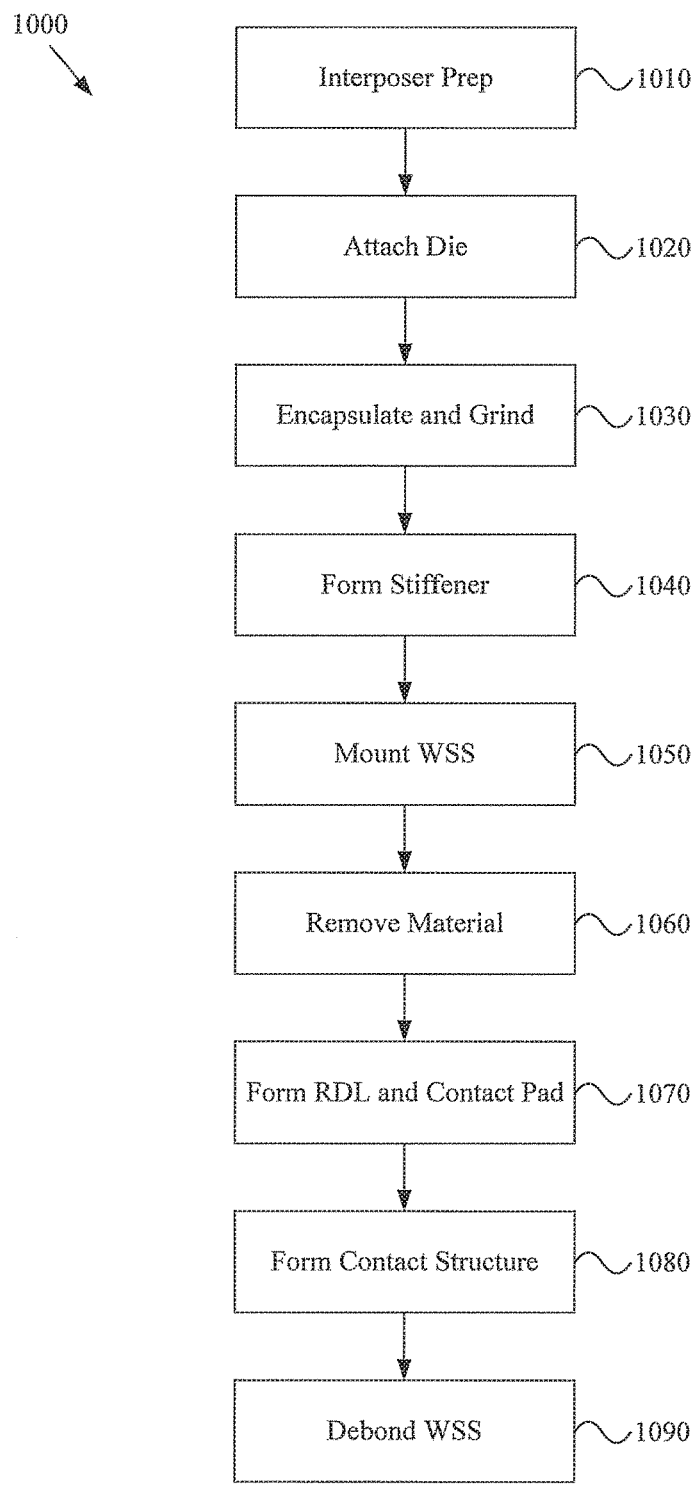
FIG. 10 is a flowchart illustrating an example method for manufacturing a semiconductor device, in accordance with various aspects of the present disclosure.

FIG. 10 is a flowchart illustrating an example method 1000 for manufacturing a semiconductor device, in accordance with various aspects of the present disclosure.

Referring to FIG. 10, the example method 1000 of manufacturing a semiconductor device may, for example, comprise interposer preparing 1010, die attaching 1020, encapsulating and grinding 1030, stiffener forming 1040, mounting a WSS 1050, removing material 1060, forming an RDL and contact pad 1070, forming a contact structure 1080, and WSS debonding 1090. The example method 1000 may, for example, share any or all characteristics with the other methods discussed herein. The example manufacturing method of FIG. 10 will now be described in more detail with reference to FIGS. 11A to 11I.

FIGS. 11A to 11I show cross-sectional views illustrating various aspects of the example method 1000 shown in FIG. 10. It should be noted that FIGS. 11A to 11I merely provide examples of various aspects of the method 1000 shown in FIG. 10. Accordingly, the scope of various aspects of the method 1000 should not be limited by the example illustrations of FIGS. 11A to 11I.

Figure 11A:
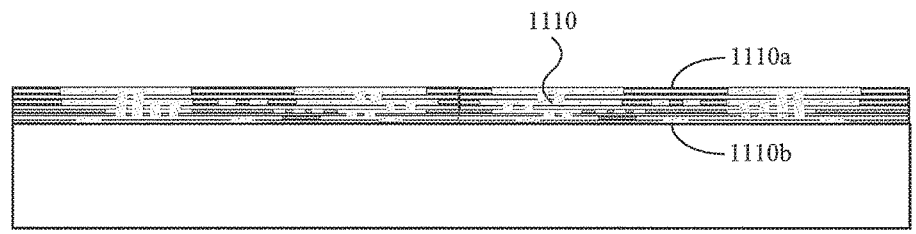
FIGS. 11A to 11I show cross-sectional views illustrating various aspects of the example method shown in FIG. 10.

First, as illustrated in FIG. 11A, an interposer 1110 is prepared. The interposer 1110 may, for example, be formed on a wafer substrate (e.g., a silicon wafer substrate), a substrate from a singulated wafer, etc. The interposer may, for example be formed by a fabrication (FAB) process, but the present disclosure is not limited to the utilization of a fabrication process. Various examples of interposer formation are presented herein. The interposer 1110 may have a first surface 1110*a* and a second surface 1110*b* opposite to the first surface 1110*a*.

As shown in FIG. 11A, the interposer 1110 is formed on a full-thickness wafer. In such an example scenario, the wafer need not be full thickness at this point. For example, the wafer may have been at least partially thinned at a previous process step.

Figure 11B:
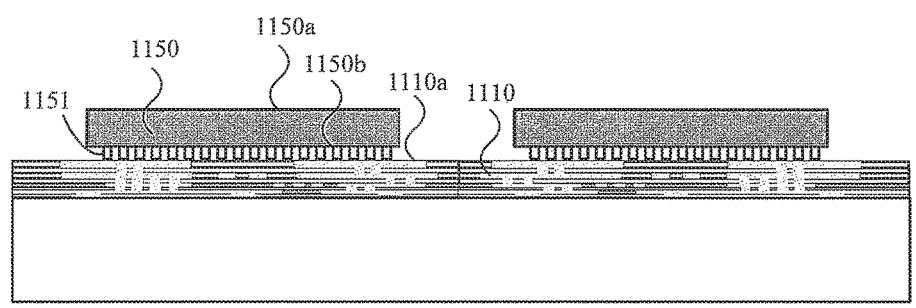

As illustrated in FIG. 11B, one or more semiconductor die 1150 are attached. For example, the semiconductor die 1150 may be electrically connected to the interposer 1110 (e.g., to the first surface 1110*a* of the interposer 1110. The semiconductor die 1150 has a first surface 1150*a* and a second surface 1150*b* opposite to the first surface 1150*a*, and a die contact 1151 is provided on the second surface 1150*b*. The semiconductor die 1150 is electrically connected to the interposer 1110 through the die contact 1151 (and others like it). For example, the semiconductor die 1150 may be connected to the interposer 1110 in a flip chip configuration. The die contact 1151 may, for example, further include a solder cap formed at its end to facilitate a connection with the interposer 1110. The die contact 1151 may, for example, generally include a conductive structure formed on and/or attached to bond pads on the die 1150 (e.g., a bump on a bumped die, etc.).

Figure 11C:
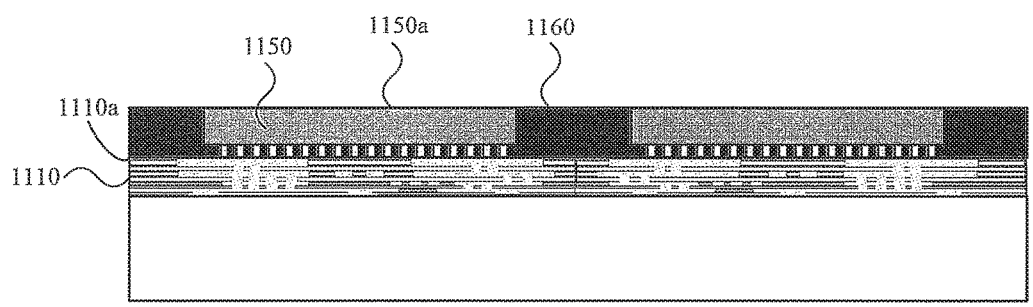

As illustrated in FIG. 11C, encapsulant 1160 (e.g., mold material) is applied and ground. The interposer 1110 and the semiconductor die 1150 may be encapsulated by the encapsulant 1160. The encapsulant 1160 may, for example, be formed to entirely cover the first surface 1110*a* of the interposer 1110 and the semiconductor die 1150. Such covering may then, for example if exposure of the semiconductor die 1150 is desired, be followed by back grinding and/or etching or otherwise thinning (if needed) to allow the first surface 1150*a* of the semiconductor die 1150 to be exposed from the encapsulant 1160 and/or thinned. In other examples, the first surface 1150*a* of the die 1150 may be left uncovered by the encapsulant 1160 during encapsulation. The interposer 1110 and the semiconductor die 1150 may be environmentally and/or electrically protected from external circumstances by the encapsulant 1160. The encapsulant 1160 may, for example, include general epoxy, paste, molding compound, and equivalents thereof, but is not limited thereto.

Note that although the mold material 1160 is illustrated underfilling the die 1150, a separate underfill may be utilized. Such underfilling is discussed herein (e.g., injected, deposited, taped, etc.) with regard to other examples.

Figure 11D:
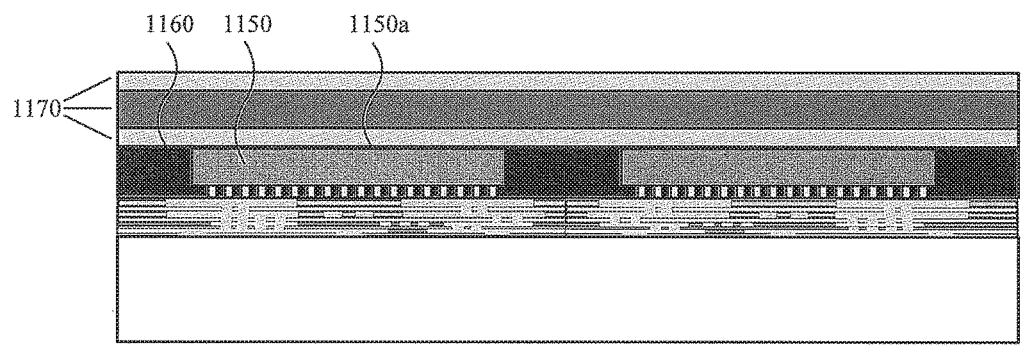

As illustrated in FIG. 11D, a stiffener 1170 is formed. Non-limiting example stiffeners are presented herein in the discussions of FIGS. 7C and 9H, but the scope of this disclosure is not limited by the characteristics of such examples. The stiffener 1170 may, for example, be formed on (e.g., directly on) the surface of the encapsulant 1160 and/or the first surface 1150*a* of the semiconductor die 1150. The stiffener 1170 may be formed in any of a variety of manners. For example, the stiffener 1170 may be formed by sputtering, chemical vapor deposition, plating, etc., on the encapsulant 1160 and/or first surface 1150*a*. In other words, the stiffener 1170 may be integrally coupled to the encapsulant 1160 and/or die 1150 without using adhesive, and thus for example act more directly to counteract warpage in the underlying structure than would be possible with an intervening adhesive layer.

In the example shown in FIG. 11D, the stiffener 1170 comprises three conductive layers, for example two outer layers (e.g., copper layers) and a middle layer (e.g., nickel), though any number of layers may be utilized (e.g., single layer, dual layer, etc.). Though the two outer layers are shown with a same thickness, they may be formed with different respective thicknesses. Though the center layer is shown thicker than the outer layers, the center layer may be the same thickness or thinner than one or both of the outer layers. Also, though the two outer layers may comprise a same material (e.g., copper), they comprise different materials.

In general, the composition and/or geometry of the stiffener 1170 layer(s) may be selected to counteract warpage forces acting on the structure comprising the interposer 1110, RDL 1115 (discussed below), die 1150, mold material 1160, etc. For example, if the stiffener-less structure comprises forces (e.g., thermal mismatch forces) acting to cause the ends of the structure to bend upward with a force F, the stiffener layer(s) 1170 may be selected to provide a force acting to cause the ends of the stiffener 1170 to bend downward with an opposite force −F, resulting in an overall structure for the electronic package that stays generally flat under the influence of a variety of temperature conditions.

The warpage forces may, for the stiffener-less structure and/or the stiffener, be determined theoretically and/or empirically.

The stiffener 1170 layer(s) may also, for example, be continuous or uniform across the surface on which they are formed rather than patterned. Note, however, that in various example implementations some or all of the stiffener 1170 layers may be patterned (e.g., to account for varying stress conditions across the electronic package) and/or may have a varying thickness.

The example stiffener 1170 discussed herein is generally formed from conductive metal material, but may be formed from any of a variety of materials. For example, the stiffener 1170 may comprise composites, oxides, nitrides, etc. In a scenario comprising the utilization of materials such as oxides and/or nitrides, sputtering or other techniques may be utilized to form the stiffener 1170 layer(s).

The stiffener 1170, when formed at least in part of conductive material, may be utilized to provide electromagnetic shielding for the electronic components of the package. Additionally, for example, the stiffener 1170 may be utilized to provide ground and/or power signals to one or more components of the package (or other devices stacked on the package).

As shown in this example, the stiffener 1170 layer(s) may be formed prior to removal of the excess material and removal of the WSS 1140 (discussed below).

Figure 11E:
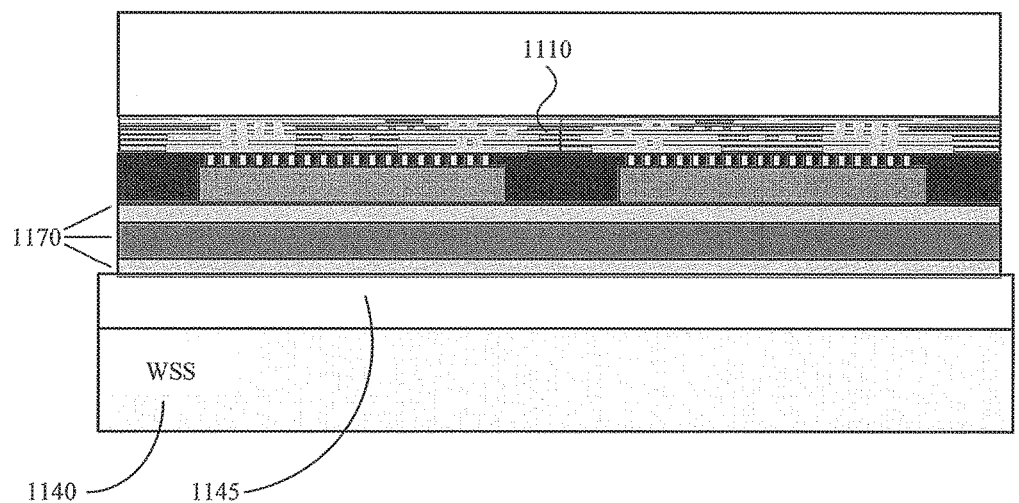

As illustrated in FIG. 11E, a wafer support system (WSS) 1140 is mounted to the stiffener 1170. The WSS 1140 may, for example, be mounted to the stiffener 1170 using an adhesive 1145 (or epoxy). The WSS 1140 may comprise any of a variety of materials. For example, as with all wafer support systems discussed herein, the WSS 1140 may comprise glass, metal, ceramic, general dielectric material, etc. The WSS 1140 may, for example, support and fix the interposer 1110 in a state in which material (e.g., excess silicon or other material) may be removed from the interposer 1110.

Figure 11F:
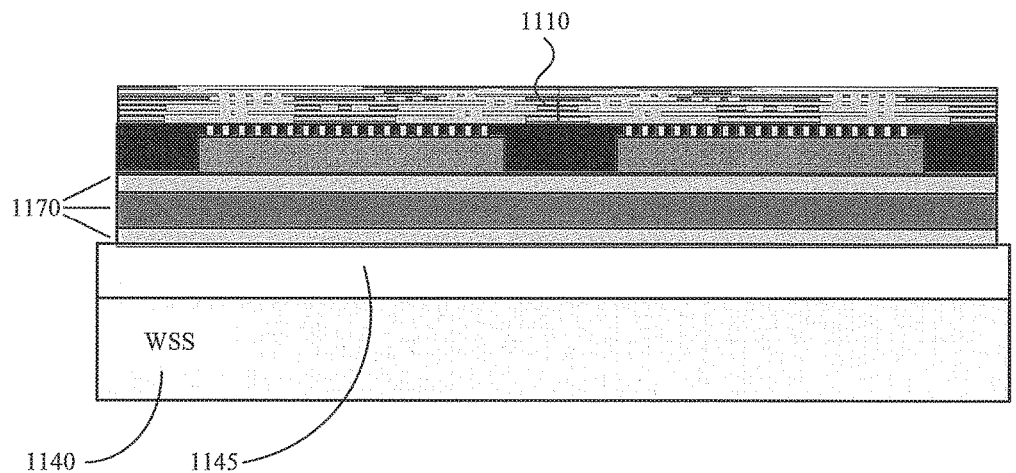
Figure 11G:
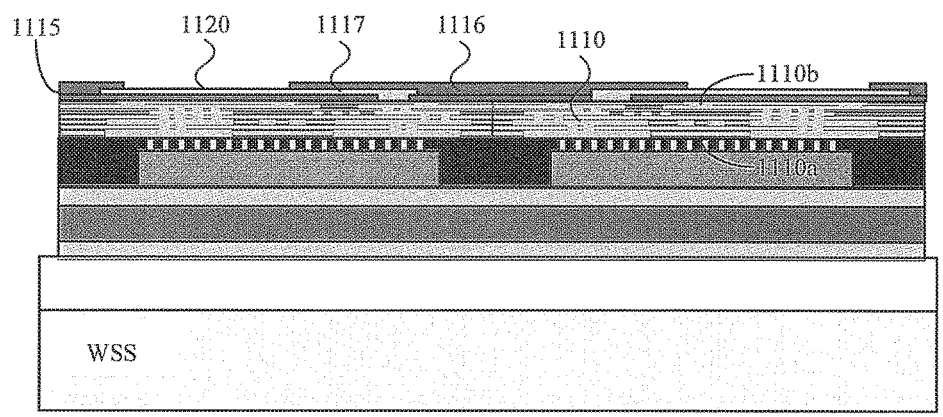

As illustrated in FIG. 11F, material is removed from the interposer 1110. For example, in an example implementation in which traces of the interposer 1110 are formed on a silicon wafer, for example in a FAB process, the excess wafer material may be removed (e.g., by grinding and/or etching, ablating, etc.). The WSS 1140, for example, may provide primary structural support for the interposer 1110, RDL 1115 (discussed below), and/or contact structure 1130 (discussed below) when the interposer 1110 is thinned. In an example implementation in which the interposer 1110 is fabricated on a silicon wafer, the resulting thickness of the interposer 1110 may, for example, be in the range of 8-10 microns or thinner As illustrated in FIG. 11G, a redistribution layer (RDL) 1115, which may also be referred to herein as a second interposer, and a contact pad 1120 are formed (e.g., on the second surface 1110b of the interposer 1110). The RDL 1115 and contact pad 1120 may be formed in any of a variety of manners generally associated with such structures. For example, the RDL 1115 may be formed by forming a dielectric layer 1116 and forming a conductive layer 1117 on and/or extending through the dielectric layer. Such dielectric layer 1116 and conductive layer 1117 forming may then be repeated multiple times if a multi-layer RDL is desired. The RDL 1115 may, for example, be formed in a process step that is independent from the forming of the interposer 1110. In an example scenario, the interposer 1110 may be formed in a FAB process, and the RDL 1115 may be formed in a post-FAB process. The RDL 1115 may, for example, be formed using different dielectric material, different conductive material, wider material, thicker material, etc., than the interposer 1110. The contact pad 1120 (e.g., a bump pad) may, for example, be formed as a conductive portion of the RDL 1115 that is exposed through dielectric material. The contact pad 1120 may, for example, be coated (e.g., plated) with an under-contact metal (e.g., an under-bump metal (UBM)) to enhance attachment of a contact structure to the contact pad 1120 in a later process step.

Figure 11H:
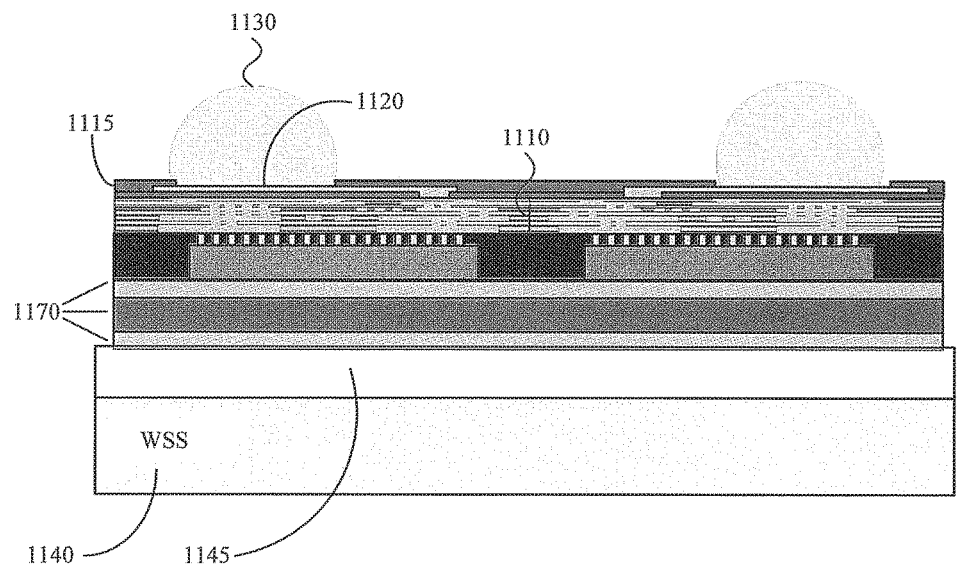

As illustrated in FIG. 11H, a contact structure 1130 (such as conductive bumps or balls, plated or wire pillars, or other contact structures comprising solder, copper, and/or other conductive material) may further be formed on the contact pad 1120. The contact structure 1130 is electrically connected to the contact pad 1120. For example, in an implementation utilizing a conductive ball, volatile flux may be applied to the contact pad 1120, and the contact structure 1130 comprising a conductive ball can be positioned on the flux, followed by applying heat of a temperature ranging from approximately 150° C. to approximately 250° C. or 270° C. thereby connecting the contact structure 1130 to the contact pad 1120 while allowing the flux to volatilize. Thereafter, a cooling process may be performed to solidify the mechanical/electrical connection between the contact structure 1130 and the contact pad 1120.

Figure 11I:
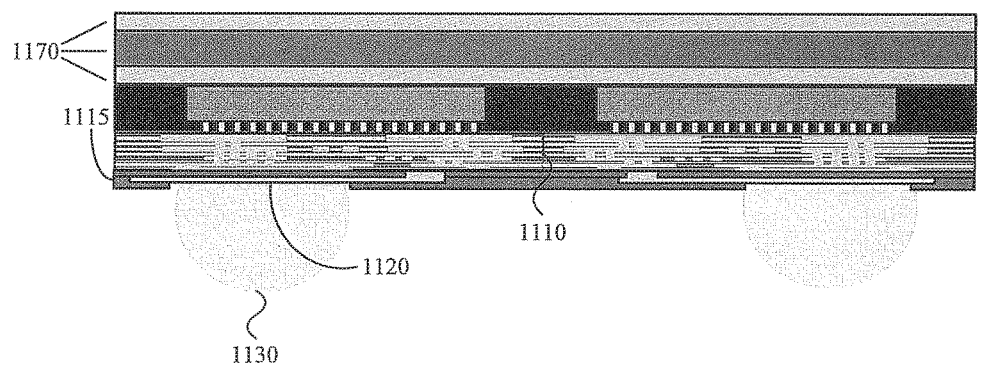

As illustrated in FIG. 11I, the wafer support system (WSS) 1140 is removed (e.g., debonded). For example, the WSS 1140 and adhesive 1145 may be removed, for example by mechanical, chemical, and/or electrical means. The WSS 1140 may, for example, be removed in a non-destructive manner, thus preserving the WSS 1140 for use in the formation of another package.

The WSS 1140 debonding step may, for example, complete formation of the electronic package. Note, however, that further processing steps may also be performed. For example, in an implementation in which the contact structures 1130 have not yet been formed, they may now be formed. Also for example, as shown herein, a dicing step may be performed. Additionally for example, the completed semiconductor device may be mounted to be electrically connected (e.g., directly connected) to a printed circuit board (PCB) or other substrate (or wafer, other semiconductor device, die, etc.) through the contact structures 1130.

The examples presented herein have address the above-described drawbacks by providing a method for manufacturing a semiconductor device and the semiconductor device produced thereby, which can prevent warpage deformation from occurring to a wafer due to, for example, a difference in the thermal coefficient between a semiconductor die and an interposer or redistribution layer, and/or between various other semiconductor device components, by for example arranging encapsulating the semiconductor die and a redistribution layer as a final (or later) process, for example after the formation of the interposer, by incorporating various stiffening structures, etc.

In accordance with various aspects of the present disclosure, there is provided herein a manufacturing method of a semiconductor device, the manufacturing method including forming an interposer including a redistribution layer and a dielectric layer on one surface of a dummy substrate, connecting contact structures to a first surface of the interposer, removing the dummy substrate, attaching a wafer support system (WSS) on the first surface of the interposer and the contact structures connected to the first surface of the interposer, connecting a semiconductor die to a second surface of the interposer opposite to the first surface of the interposer, encapsulating the second surface of the interposer and the semiconductor die using an encapsulant, grinding the encapsulant to expose one surface of the semiconductor die, removing the WSS, and connecting the first surface of the interposer from which the WSS is removed to a circuit board.

In accordance with various aspects of the present disclosure, there is provided herein a manufacturing method of a semiconductor device, the manufacturing method including forming an interposer including a redistribution layer and a dielectric layer on one surface of a dummy substrate, connecting contact structures to a first surface of the interposer, first encapsulating the first surface of the interposer and the contact structures using a first encapsulant, removing the dummy substrate, attaching a wafer support system (WSS) on the first surface of the interposer and the contact structures connected to the first surface of the interposer, connecting the semiconductor die to a second surface of the interposer opposite to the first surface of the interposer, second encapsulating the second surface of the interposer and the semiconductor die using a second encapsulant, grinding the second encapsulant to expose one surface of the semiconductor die, and removing the WSS.

In accordance with various aspects of the present disclosure, there is provided herein a semiconductor device including an interposer having a first surface and a second surface opposite to the first surface and including a redistribution layer and a dielectric layer, a contact structures connected to the first surface of the interposer, a first encapsulant layer encapsulating the first surface of the interposer and the contact structures, a semiconductor die mounted on the second surface of the interposer and electrically connected to the redistribution layer, and a second encapsulant layer encapsulating the second surface of the interposer and the semiconductor die.

In accordance with various aspects of the present disclosure, there is provided herein a manufacturing method of a semiconductor device, the manufacturing method including forming a first interposer including a first redistribution layer and a first dielectric layer on a first surface of a dummy substrate, attaching a first wafer support system (WSS) on a first surface of the first interposer, removing the dummy substrate, forming a second interposer including a second redistribution layer and a second dielectric layer on a second surface of the first interposer, opposite to the first surface of the first interposer, attaching a second WSS on a first surface of the second interposer, removing the first WSS, connecting a semiconductor die on the first surface of the first interposer, encapsulating the first surface of the first interposer and the semiconductor die using an encapsulant, grinding the encapsulant to expose one surface of the semiconductor die, and removing the second WSS.

In accordance with various aspects of the present disclosure, there is provided a manufacturing method of a semiconductor device, the manufacturing method including forming a first interposer including a first redistribution layer and a first dielectric layer on a first surface of a dummy substrate, attaching a first wafer support system (WSS) on a first surface of the first interposer, removing the dummy substrate, forming a second interposer including a second redistribution layer and a second dielectric layer on a second surface of the first interposer, opposite to the first surface of the first interposer, attaching a second WSS on a first surface of the second interposer, removing the first WSS, connecting a semiconductor die on the first surface of the first interposer, forming a copper contact between the semiconductor dies on the first surface of the first interposer, encapsulating the first surface of the first interposer, the semiconductor die and the copper contact using an encapsulant, grinding the encapsulant to expose one surface of the copper contact, and connecting a solder ball to the one surface of the copper contact.

In accordance with various aspects of the present disclosure, there is provided a semiconductor device including an interposer having a first surface and a second surface opposite to the first surface and including a redistribution layer and a dielectric layer, a semiconductor die mounted on the first surface of the interposer and electrically connected to the redistribution layer, a copper contact formed between the semiconductor dies on the first surface of the interposer, an encapsulation layer encapsulating the first surface of the interposer and the semiconductor die, and a solder ball formed at an exposed end of the copper contact.

In accordance with various aspects of the present disclosure, there is provided a manufacturing method of a semiconductor device, the manufacturing method including forming a first interposer including a first redistribution layer and a first dielectric layer on a first surface of a dummy substrate, forming a second interposer including a second redistribution layer and a second dielectric layer on the first surface of the dummy substrate, forming one or insulation fillers on a first surface of the second interposer, forming one or more conductive pad layers connected to the second redistribution layer between the first surface of the second interposer and the insulation fillers, connecting contact structures on conductive pad layers alternately formed among conductive pad layers between the insulation fillers, attaching a wafer support system (WSS) on a first surface of the first interposer, removing the dummy substrate, connecting a semiconductor die to a second surface of the first interposer, opposite to the first surface of the first interposer, encapsulating the second surface of the first interposer and the semiconductor die using an encapsulant, and removing the WSS.

In accordance with various aspects of the present disclosure, there is provided a semiconductor device including an interposer having a first surface and a second surface opposite to the first surface and including a redistribution layer and a dielectric layer, a semiconductor die mounted on the first surface of the interposer and electrically connected to the redistribution layer, an encapsulant layer encapsulating the first surface of the interposer and the semiconductor die, one or more insulation fillers formed on the second surface opposite to the first surface of the interposer to be spaced apart from each other, conductive pad layers electrically connected to the redistribution layer between the insulation fillers on the second surface of the interposer, and contact structures formed on the conductive pad layers alternately formed among the conductive pad layers between the insulation fillers In summary, various aspects of this disclosure provide a semiconductor device structure and a method for manufacturing a semiconductor device. While the foregoing has been described with reference to certain aspects and embodiments, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular embodiment(s) disclosed, but that the disclosure will include all embodiments falling within the scope of the appended claims.

What is claimed is:

1. A method of manufacturing a semiconductor device, the method comprising:
    providing an interposer structure comprising a base material and an interposer directly on the base material, the interposer comprising a first interposer side facing the base material, a second interposer side opposite the first interposer side, and lateral interposer sides extending between the first interposer side and the second interposer side, the interposer comprising an interposer conductive layer and an interposer dielectric layer;
    forming a stiffener on the second interposer side, the stiffener comprising a first stiffener side coupled to the second interposer side without an intervening layer of adhesive between the first stiffener side and the second interposer side, a second stiffener side opposite the first stiffener side, and lateral stiffener sides between the first stiffener side and the second stiffener side;
    removing the base material from the first interposer side;
    coupling a semiconductor die to the interposer, the semiconductor die comprising a first die side, a second die side opposite the first die side and coupled to the first interposer side, and lateral die sides extending between the first die side and the second die side; and
    encapsulating at least the first interposer side and the lateral die sides with an encapsulating material, the encapsulating material comprising a first encapsulating material side, a second encapsulating material side opposite the first encapsulating material side and coupled to the first interposer side, and lateral encapsulating material sides extending between the first encapsulating material side and the second encapsulating material side.

2. The method of claim 1, wherein the stiffener comprises a metal layer comprising a plurality of first pad portions and a second portion, and said forming the stiffener comprises:
    forming the first pad portions on and electrically coupled to the interposer conductive layer; and
    forming the second portion on the interposer dielectric layer and electrically isolated from the first pad portions.

3. The method of claim 2, wherein the second portion of the metal layer is electrically isolated from the interposer conductive layer.

4. The method of claim 2, comprising forming a plurality of electrical contact structures for coupling the semiconductor device to another device, said forming the plurality of electrical contact structures comprising forming the plurality of electrical contact structures such that:
    each of the plurality of electrical contact structures is coupled to a respective one of the first pad portions of the metal layer; and
    no electrical contact structures for coupling the semiconductor device to another device are coupled to the second portion of the metal layer.

5. The method of claim 1, wherein the stiffener comprises only a single layer of metal.

6. The method of claim 1, wherein said forming the stiffener comprises forming a first metal layer of a first metal, and forming a second metal layer of a second metal different from the first metal.

7. The method of claim 1, wherein each of the lateral interposer sides is coplanar with a respective one of the lateral stiffener sides and a respective one of the lateral encapsulating material sides.

8. A semiconductor device comprising:
    an interposer comprising a top interposer side, a bottom interposer side, and lateral interposer sides extending between the top interposer side and the bottom interposer side, the interposer comprising an interposer conductive layer and an interposer dielectric layer;
    a semiconductor die coupled to the interposer, the semiconductor die comprising a top die side, a bottom die side coupled to the top interposer side, and lateral die sides extending between the top die side and the bottom die side;
    an encapsulating material encapsulating at least the top interposer side and the lateral die sides, the encapsulating material comprising a top encapsulating material side, a bottom encapsulating material side coupled to the top interposer side, and lateral encapsulating material sides extending between the top encapsulating material side and the bottom encapsulating material side; and
    a stiffener comprising a top stiffener side coupled to the bottom interposer side without an intervening layer of adhesive between the top stiffener side and the bottom interposer side, a bottom stiffener side, and lateral stiffener sides extending between the top stiffener side and the bottom stiffener side, wherein:
        the stiffener comprises a metal layer comprising a plurality of first pad portions and a second portion;
        the first pad portions of the metal layer are on and electrically coupled to the interposer conductive layer; and
        the second portion of the metal layer is on the interposer dielectric layer and electrically isolated from the first pad portions.

9. The semiconductor device of claim 8, wherein the first metal layer is a layer of a first metal, and the stiffener further comprises a second metal layer of a second metal different from the first metal.

10. The semiconductor device of claim 8, wherein the second portion of the metal layer is electrically isolated from the interposer conductive layer.

11. The semiconductor device of claim 8, comprising a plurality of electrical contact structures for coupling the semiconductor device to another device, wherein:
    each of the plurality of electrical contact structures is coupled to a respective one of the first pad portions of the metal layer; and
    no electrical contact structures for coupling the semiconductor device to another device are coupled to the second portion of the metal layer.

12. The semiconductor device of claim 8, wherein the metal layer of the stiffener is the only metal layer of the stiffener.

13. A semiconductor device comprising:
    an interposer comprising a top interposer side, a bottom interposer side, and lateral interposer sides extending between the top interposer side and the bottom interposer side, the interposer comprising an interposer conductive layer and an interposer dielectric layer;
    a semiconductor die coupled to the interposer, the semiconductor die comprising a top die side, a bottom die side coupled to the top interposer side, and lateral die sides extending between the top die side and the bottom die side;
    an encapsulating material encapsulating at least the top interposer side and the lateral die sides, the encapsulating material comprising a top encapsulating material side, a bottom encapsulating material side coupled to the top interposer side, and lateral encapsulating material sides extending between the top encapsulating material side and the bottom encapsulating material side; and a stiffener comprising a top stiffener side coupled to the bottom interposer side without an intervening layer of adhesive between the top stiffener side and the bottom interposer side, a bottom stiffener side, and lateral stiffener sides extending between the top stiffener side and the bottom stiffener side, wherein the stiffener comprises a first metal layer of a first metal, and a second metal layer of a second metal different from the first metal.

14. The semiconductor device of claim 8, wherein each of the lateral interposer sides is coplanar with a respective one of the lateral stiffener sides and a respective one of the lateral encapsulating material sides.

15. A semiconductor device comprising:

an interposer having a top interposer side, a bottom interposer side, and lateral interposer sides extending between the top interposer side and the bottom interposer side;

a semiconductor die coupled to the interposer, the semiconductor die comprising a top die side, a bottom die side coupled to the top interposer side, and lateral die sides extending between the top die side and the bottom die side;

an encapsulating material encapsulating at least the top interposer side and the lateral die sides, the encapsulating material having a top encapsulating material side, a bottom encapsulating material side coupled to the top interposer side, and lateral encapsulating material sides extending between the top encapsulating material side and the bottom encapsulating material side; and a stiffener comprising a top stiffener side, a bottom stiffener side directly on at least the top encapsulating material side without an intervening layer of adhesive between the bottom stiffener side and the top encapsulating material side, and lateral stiffener sides extending between the top stiffener side and the bottom stiffener side, wherein the stiffer comprises a metal layer.

16. The semiconductor device of claim 15, wherein the stiffener comprises only the metal layer.

17. The semiconductor device of claim 15, wherein the metal layer comprises a copper layer.

18. The semiconductor device of claim 15, wherein the metal layer comprises a nickel layer.

19. The semiconductor device of claim 15, wherein each of the lateral stiffener sides is coplanar with a respective one of the lateral encapsulating material sides and a respective one of the lateral interposer sides.

20. The semiconductor device of claim 15, wherein the bottom stiffener side is directly on the top die side without an intervening layer of adhesive between the bottom stiffener side and the top die side.

* * * * *